(12) United States Patent
Hwang et al.

(10) Patent No.: US 10,566,502 B2
(45) Date of Patent: Feb. 18, 2020

(54) SEMICONDUCTOR LIGHT-EMITTING DEVICE

(71) Applicant: SAMSUNG ELECTRONICS CO., LTD., Suwon-si (KR)

(72) Inventors: Kyung Wook Hwang, Hwaseong-si (KR); Si Han Kim, Seoul (KR); Wan Tae Lim, Suwon-si (KR); Eun Joo Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 734 days.

(21) Appl. No.: 15/171,087

(22) Filed: Jun. 2, 2016

(65) Prior Publication Data

US 2016/0372636 A1 Dec. 22, 2016

(30) Foreign Application Priority Data

Jun. 17, 2015 (KR) .................. 10-2015-0086020

(51) Int. Cl.
*H01L 33/46* (2010.01)
*H01L 33/32* (2010.01)
(Continued)

(52) U.S. Cl.
CPC .............. *H01L 33/46* (2013.01); *H01L 33/22* (2013.01)

(58) Field of Classification Search
None
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 1897313 A 1/2007
CN 102163675 A 8/2011
(Continued)

OTHER PUBLICATIONS

Communication dated Mar. 22, 2019, issued by the State Intellectual Property Office of the People's Republic of China in counterpart Chinese Patent Application No. 201610437305.8.

*Primary Examiner* — Robert K Carpenter
(74) *Attorney, Agent, or Firm* — Sughrue Mion, PLLC

(57) ABSTRACT

A semiconductor light-emitting device includes a light-emitting stack including a first conductivity-type semiconductor layer, a second conductivity-type semiconductor layer, and an active layer disposed between the first conductivity-type semiconductor layer and the second conductivity-type semiconductor layer, a wavelength conversion layer disposed on the light-emitting stack and configured to convert at least some of light having a first wavelength, emitted from the active layer, into light having a second wavelength, and a light control layer disposed between the light-emitting stack and the wavelength conversion layer, and including a first insulating layer and a second insulating layer, the first insulating layer having a refractive index lower than a refractive index of the light-emitting stack, and the second insulating layer having a refractive index higher than a refractive index of the first insulating layer by 0.5 or more.

13 Claims, 16 Drawing Sheets

(51) Int. Cl.
*H01L 33/58* (2010.01)
*H01L 33/42* (2010.01)
*H01L 33/50* (2010.01)
*H01L 33/56* (2010.01)
*H01L 33/06* (2010.01)
*H01L 33/22* (2010.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,467,023 B2 | 6/2013 | Nishida et al. |
| 8,502,242 B2 | 8/2013 | Kim |
| 8,536,604 B2 | 9/2013 | Kwak et al. |
| 8,670,171 B2 * | 3/2014 | Martin | G02B 3/0012 359/224.1 |
| 8,735,931 B2 | 5/2014 | Han et al. |
| 8,766,295 B2 | 7/2014 | Kim |
| 8,950,924 B2 | 2/2015 | Wheatley et al. |
| 2007/0228393 A1 * | 10/2007 | Yoneda | H01L 33/22 257/79 |
| 2009/0121241 A1 | 5/2009 | Keller et al. |
| 2009/0236621 A1 | 9/2009 | Chakraborty |
| 2011/0186813 A1 | 8/2011 | Kim |
| 2011/0198644 A1 | 8/2011 | Hwang et al. |
| 2012/0138988 A1 | 6/2012 | Lee et al. |
| 2013/0087821 A1 | 4/2013 | Do et al. |
| 2013/0285540 A1 | 10/2013 | Jo et al. |
| 2013/0334539 A1 | 12/2013 | Kojima et al. |
| 2014/0185299 A1 | 7/2014 | Sanga et al. |
| 2014/0252388 A1 | 9/2014 | Kimura et al. |
| 2015/0021620 A1 | 1/2015 | Sung et al. |
| 2015/0171370 A1 | 6/2015 | Ehrensperger et al. |

FOREIGN PATENT DOCUMENTS

| | | |
|---|---|---|
| CN | 102163684 A | 8/2011 |
| CN | 102239578 A | 11/2011 |
| CN | 102318091 A | 1/2012 |
| CN | 102543981 A | 7/2012 |
| CN | 102588816 A | 7/2012 |
| CN | 103403888 A | 11/2013 |
| CN | 103915533 A | 7/2014 |
| CN | 104037299 A | 9/2014 |
| JP | 201149234 A | 3/2011 |
| JP | 4688553 B2 | 5/2011 |
| JP | 5523870 B2 | 6/2014 |
| JP | 2014175430 A | 9/2014 |
| KR | 20010045075 A | 6/2001 |
| KR | 1020100129766 A | 12/2010 |
| KR | 101321994 B1 | 10/2013 |
| KR | 101387918 B1 | 4/2014 |
| KR | 10-2014-0096653 A | 8/2014 |
| KR | 1020140122846 A | 10/2014 |
| KR | 1020140142636 A | 12/2014 |
| KR | 1020150010113 A | 1/2015 |
| KR | 1020150011908 A | 2/2015 |
| KR | 101503558 B1 | 3/2015 |
| KR | 1020150024816 A | 3/2015 |
| KR | 10-2015-0062352 A | 6/2015 |
| WO | 2010/064177 A1 | 6/2010 |
| WO | 2010/104276 A2 | 9/2010 |

* cited by examiner

SEMICONDUCTOR LIGHT-EMITTING DEVICE

CROSS-REFERENCE TO RELATED APPLICATION

This application claims priority from Korean Patent Application No. 10-2015-0086020, filed on Jun. 17, 2015, with the Korean Intellectual Property Office, the disclosure of which is incorporated herein in its entirety by reference.

BACKGROUND

1. Field

Apparatuses consistent with example embodiments relate to a semiconductor light-emitting device.

2. Description of the Related Art

Semiconductor light-emitting diodes (LEDs) are devices in which a material emits light in response to electric energy applied thereto, particularly, energy generated by the recombination of electrons and holes in a semiconductor junction. The LEDs are widely used as light sources of illumination apparatuses and/or backlight apparatuses of large liquid crystal displays (LCDs), and thus the development thereof is continuously being conducted.

Recently, the range of applications of LEDs has been gradually broadened to include light sources in high-current and high-power applications. Accordingly, a light-emitting device structure having improved light extraction efficiency is desirable.

SUMMARY

One or more example embodiments may provide semiconductor light-emitting devices having improved light extraction efficiency.

According to an aspect of an example embodiment, a semiconductor light-emitting device may include a light-emitting stack having a first conductivity-type semiconductor layer, a second conductivity-type semiconductor layer, and an active layer disposed between the first conductivity-type semiconductor layer and the second conductivity-type semiconductor layer, a wavelength conversion layer disposed on the light-emitting stack and configured to convert at least some of light having a first wavelength, emitted from the active layer, into light having a second wavelength, and a light control layer disposed between the light-emitting stack and the wavelength conversion layer, and including a first insulating layer having a lower refractive index than a refractive index of the light-emitting stack, and a second insulating layer having a higher refractive index than a refractive index of the first insulating layer by 0.5 or more.

In some example embodiments, the refractive index of the first insulating layer may be in a range of 1.4 to 1.8, and the refractive index of the second insulating layer may be in a range of 2.2 to 2.5.

In some example embodiments, the first insulating layer is disposed on the light-emitting stack, and the second insulating layer is disposed on the first insulating layer.

In some example embodiments, the light control layer may have a multilayer structure in which a plurality of first insulating layers and a plurality of second insulating layers are alternately and repeatedly stacked.

In some example embodiments, the first insulating layer may include at least one of $SiO_2$, $MgF_2$, and $Al_2O_3$, and the second insulating layer may include at least one of $ZrO_2$, $NbO_2$, $Ta_2O_3$, $TiO_2$, $CeO_2$, and $Si_3N_4$.

In some example embodiments, the first insulating layer may have a thickness in a range of 1 nm to 96 nm, and the second insulating layer may have a thickness in a range of 64 nm to 180 nm.

In some example embodiments, the first insulating layer may include $SiO_2$ having a thickness in a range of 2 to 70 nm and the second insulating layer may include $TiO_2$ having a thickness in a range of 105 nm to 135 nm.

In some example embodiments, a light-emitting surface of the light-emitting stack may have an uneven structure, and the light control layer may be disposed on the uneven structure.

In some example embodiments, the uneven structure may have at least one of a pyramid shape, a cone shape, and a hemispherical shape.

In some example embodiments, the semiconductor light-emitting device may further include a micro lens portion disposed between the light control layer and the wavelength conversion layer, and including protrusion portions that are convex toward the wavelength conversion layer.

In some example embodiments, a refractive index of the micro lens portion may be higher than a refractive index of the wavelength conversion layer.

In some example embodiments, the semiconductor light-emitting device may further include a transparent electrode layer disposed on the first conductivity-type semiconductor layer. The light control layer may be disposed on the transparent electrode layer.

In some example embodiments, the semiconductor light-emitting device may further include a first electrode disposed on the transparent electrode layer, and a conductive support substrate disposed on the second conductivity-type semiconductor layer.

In some example embodiments, the semiconductor light-emitting device may further include a transparent electrode layer disposed on the second conductivity-type semiconductor layer, and the light control layer may be disposed on the transparent electrode layer.

In some example embodiments, the semiconductor light-emitting device may further include a first electrode disposed on the first conductivity-type semiconductor layer, and a second electrode disposed on the transparent electrode layer.

In some example embodiments, the semiconductor light-emitting device may further include a first electrode passing through the second conductivity-type semiconductor layer and the active layer to be connected to the first conductivity-type semiconductor layer, and a second electrode connected to the second conductivity-type semiconductor layer.

In some example embodiments, the semiconductor light-emitting device may further include a conductive support layer disposed on the first electrode.

According to an aspect of another example embodiment, a semiconductor light-emitting device may include a light-emitting stack including a first conductivity-type semiconductor layer, a second conductivity-type semiconductor layer, and an active layer disposed between the first conductivity-type semiconductor layer and the second conductivity-type semiconductor layer, and a light control layer disposed on the light-emitting stack and configured to increase transmittance of light having a first wavelength and emitted from the active layer and increase reflectance of light having a second wavelength greater than the first wavelength and emitted toward the light-emitting stack.

In some example embodiments, the light control layer may include a first insulating layer having a lower refractive index than a refractive index of the light-emitting stack and a second insulating layer having a higher refractive index than a refractive index of the first insulating layer by 0.5 or more, and the first insulating layer is disposed on the light-emitting stack and the second insulating layer is disposed on the first insulating layer.

In some example embodiments, the semiconductor light-emitting device may further include a wavelength conversion layer disposed on the light control layer, and the light having the second wavelength may be emitted from the wavelength conversion layer toward the light-emitting stack.

According to an aspect of still another example embodiment, a semiconductor light-emitting device may include a light-emitting stack including a light-emitting surface having an uneven structure, a wavelength conversion layer disposed on the light-emitting stack and configured to convert at least some of light having a first wavelength, emitted from the active layer, into light having a second wavelength, and a light control layer disposed between the uneven structure of the light-emitting stack and the wavelength conversion layer and including a first insulating layer having a lower refractive index than a refractive index of the light-emitting stack and a second insulating layer having a higher refractive index than a refractive index of the first insulating layer by 0.5 or more.

In some example embodiments, the first insulating layer may include $SiO_2$, and the second insulating layer may include $TiO_2$.

In some example embodiments, the first insulating layer may have a thickness in a range of 2 nm to 70 nm, and the second insulating layer may have a thickness in a range of 105 nm to 135 nm.

According to an aspect of still another example embodiment, a semiconductor light-emitting device may include a substrate including a first surface and a second surface facing opposite to the first surface, a light-emitting stack disposed on the first surface of the substrate, a wavelength conversion layer disposed on the second surface of the substrate and configured to convert at least some of light having a first wavelength, emitted from the light-emitting stack, into light having a second wavelength, and a light control layer disposed between the substrate and the wavelength conversion layer and including a first insulating layer having a lower refractive index than a refractive index of the light-emitting stack, and a second insulating layer having a higher refractive index than a refractive index of the first insulating layer by 0.5 or more.

In some example embodiments, the first insulating layer may be in contact with the substrate.

In some example embodiments, the semiconductor light-emitting device may further include a micro lens portion disposed between the light control layer and the wavelength conversion layer, and including protrusion portions that are convex toward the wavelength conversion layer.

In some example embodiments, a refractive index of the micro lens portion may be higher than a refractive index of the wavelength conversion layer.

In some example embodiments, the substrate may include sapphire, and the light-emitting stack may include Group III nitride semiconductor.

In some example embodiments, the light-emitting stack may include a first conductivity-type semiconductor layer, an active layer, and a second conductivity-type semiconductor layer. In addition, the semiconductor light-emitting device may further include a first electrode passing through the second conductivity-type semiconductor layer and the active layer to be connected to the first conductivity-type semiconductor layer, and the a second electrode connected to the second conductivity-type semiconductor layer.

In some example embodiments, the light-emitting stack may be a light-emitting nanostructure in which a first conductivity-type semiconductor nanocore, an active layer, and a second conductivity-type semiconductor layer are sequentially stacked.

In some example embodiments, the semiconductor light-emitting device may further include a first electrode connected the first conductivity-type semiconductor nanocore, and a second electrode connected to the second conductivity-type semiconductor layer.

In some example embodiments, the first insulating layer may include $SiO_2$, and the second insulating layer may include $TiO_2$.

In some example embodiments, the first insulating layer may have a thickness in a range of 2 nm to 70 nm, and the second insulating layer may have a thickness in a range of 105 nm to 135 nm.

According to an aspect of still another example embodiment, a semiconductor light-emitting device may include a light-emitting stack configured to emit light and including an uneven portion; and a light control layer disposed on or above the uneven portion of the light-emitting stack and including a first material layer and a second material layer, a refractive index of the first material layer being different from a refractive index of the second material layer. The first material layer may have a thickness in a range of 1 nm to 96 nm, and the second material layer may have a thickness in a range of 64 nm to 180 nm.

In some example embodiments, the first material layer may have a refractive index lower than a refractive index of the light-emitting stack and the second material layer may have a refractive index higher than a refractive index of the first material layer by 0.5 or more.

In some example embodiments, the semiconductor light-emitting device may further include a wavelength conversion layer disposed on the light control layer and configured to convert at least some of light having a first wavelength, emitted from the light-emitting stack, into light having a second wavelength.

In some example embodiments, the semiconductor light-emitting device may further include a substrate on which the light-emitting stack is disposed, wherein the uneven portion contacts the substrate.

BRIEF DESCRIPTION OF DRAWINGS

The above and/or other aspects will be more apparent by describing certain example embodiments with reference to the accompanying drawings, in which.

DETAILED DESCRIPTION

Figure 1:
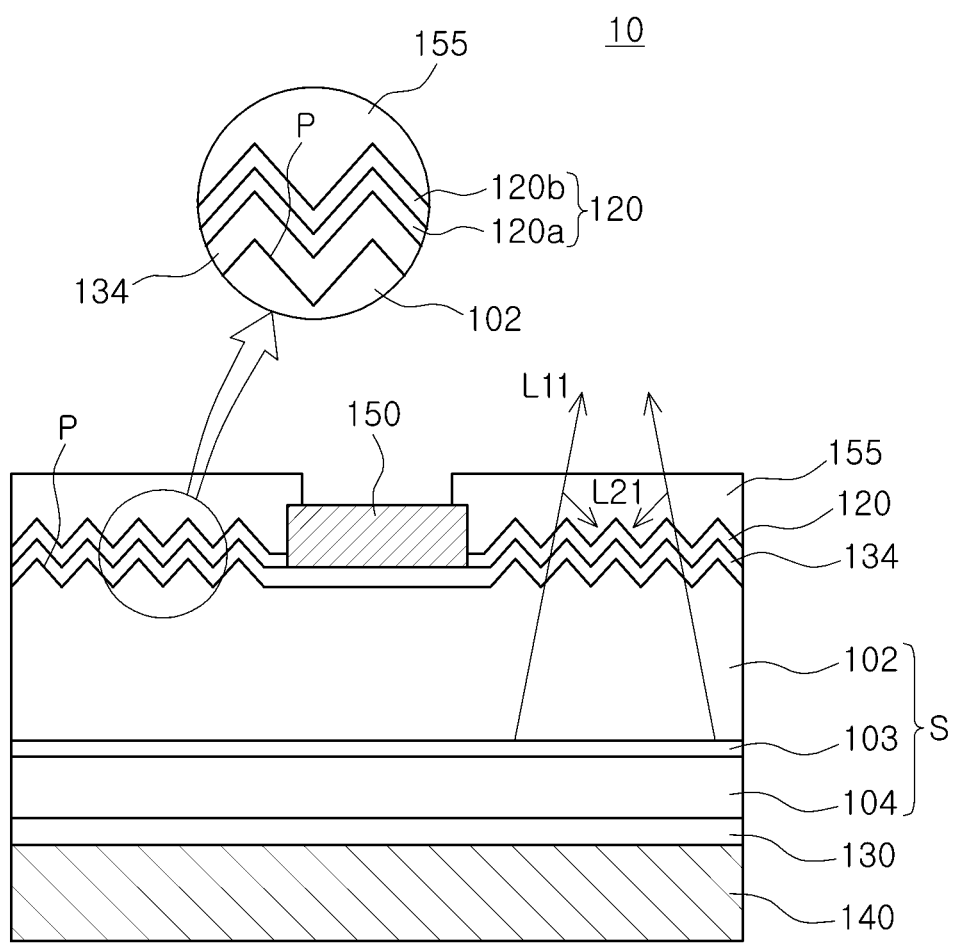
FIG. 1 is a cross-sectional view of a semiconductor light-emitting device according to an example embodiment.

Hereinafter, example embodiments will be described in detail with reference to the accompanying drawings. The inventive concept may, however, be exemplified in many different forms and should not be construed as being limited to the specific embodiments set forth herein. Embodiments are provided so that this disclosure will be thorough and complete, and will fully convey the scope of the inventive concept to those skilled in the art. In the drawings, the shapes and dimensions of elements may be exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. Herein, the term "and/or" includes any and all combinations of one or more referents.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the disclosure.

Spatially relative terms, such as "beneath," "below," "lower," "above," "upper" and the like, may be used herein for ease of description to describe one element's or feature's relationship to another elements or features as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented rotated 90 degrees or at other orientations and the spatially relative descriptors used herein interpreted accordingly.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes each and all combinations of at least one of the referred items.

Example embodiments are described herein with reference to cross-sectional views, plan views, and block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Semiconductor light-emitting devices described hereinafter may have various configurations, and only certain components will be described. However, the example embodiments are not limited thereto.

FIG. 1 is a cross-sectional view of a semiconductor light-emitting device according to an example embodiment.

A semiconductor light-emitting device 10 illustrated in FIG. 1 may include a conductive support substrate 140, a bonding layer 130, a light-emitting stack S, a light control layer 120, and a wavelength conversion layer 155. The semiconductor light-emitting device 10 may further include a transparent electrode layer 134 and a first electrode 150.

The light-emitting stack S may include a second conductivity-type semiconductor layer 104, an active layer 103, and a first conductivity-type semiconductor layer 102, sequentially stacked on the conductive support substrate 140.

The first conductivity-type semiconductor layer 102 may be a nitride semiconductor satisfying n-type $In_xAl_yGa_{1-x-y}N$ ($0 \le x < 1$, $0 \le y < 1$, and $0 \le x+y < 1$), and the n-type impurities may be Si. The second conductivity-type semiconductor layer 104 may be a nitride semiconductor layer satisfying p-type $In_xAl_yGa_{1-x-y}N$ ($0 \le x < 1$, $0 \le y < 1$, and $0 \le x+y < 1$), and the p-type impurities may be Mg. The active layer 103 may have a multiple quantum well (MQW) structure in which quantum well layers and quantum barrier layers are alternately stacked. For example, the quantum well layers and the quantum barrier layers may be $In_xAl_yGa_{1-x-y}N$ ($0 \le x \le 1$, $0 \le y \le 1$, and $0 \le x+y \le 1$) layers having different compositions. In some example embodiments, the quantum well layers may be $In_xGa_{1-x}N$ ($0 < x \le 1$), and the quantum barrier layers may be GaN or AlGaN.

The bonding layer 130 may be interposed between the conductive support substrate 140 and the second conductivity-type semiconductor layer 104. The bonding layer 130 may include an alloy having a eutectic temperature of about 200° C. or higher. For example, the bonding layer 130 may include an AuSn alloy (eutectic temperature: about 280° C.), an AuGe alloy (eutectic temperature: about 350° C.), an AuSi alloy (eutectic temperature: about 380° C.), or the like.

The conductive support substrate 140 may include one of Si, SiAl, SiC, GaP, InP, AlN, and graphite.

The light control layer 120 may be disposed on the light-emitting stack S. In the example embodiment, a surface of the first conductivity-type semiconductor layer 102 may be provided as a main light-emitting surface, and the light-emitting surface may include an uneven structure P. The uneven structure P may have, for example, a pyramid shape, a cone shape, or a hemispherical shape. The light control layer 120 may be disposed on the uneven structure P of the first conductivity-type semiconductor layer 102. In addition, the wavelength conversion layer 155 that converts at least some of the light emitted from the active layer 103 into light having a different wavelength may be disposed on the light-emitting stack S. The wavelength conversion layer 155 according to the example embodiment may include a wavelength-converting material, such as a phosphor or quantum dots. The wavelength-converting material will be described later in detail.

The uneven structure P formed on the light-emitting surface may reduce total internal reflection and effectively extract light L11 emitted from the active layer 103 outwardly. However, due to an enlarged surface area, light L21 converted by the phosphor or quantum dots in the wavelength conversion layer 155 may be re-incident to the inside of the light-emitting stack S and dissipated in the light-emitting stack S. Accordingly, it is desirable to increase transmittance of light emitted outwardly through the light-emitting surface of the light-emitting stack S and increase reflectance of light re-incident from the wavelength conversion layer 155.

According to the example embodiment, the light control layer 120 may be disposed between the light-emitting stack S and the wavelength conversion layer 155, and may increase transmittance of light having a first wavelength (e.g., blue light having a peak wavelength of 450 nm) and emitted from the light-emitting stack S, that is, emitted from the active layer 103 and incident to the wavelength conversion layer 155 and increase reflectance of light having a second wavelength (e.g., green light, yellow light, orange light, or red light, having a wavelength of 500 nm or more) greater than the first wavelength and emitted from the wavelength conversion layer 155 and incident to the light-emitting stack S.

The light control layer 120 may include a first insulating layer 120a having a lower refractive index than the light-emitting stack S, and a second insulating layer 120b having a higher refractive index than the first insulating layer 120a by 0.5 or more. The refractive index of the first insulating layer 120a may be in the range of 1.4 to 1.8, and the refractive index of the second insulating layer 120b may be in the range of 2.2 to 2.5.

The light control layer 120 may have a double layer structure in which a first insulating layer 120a is disposed on the light-emitting stack S and a second insulating layer 120b is disposed on the first insulating layer 120a. In some embodiments, the light control layer 120 may have a multilayer structure in which the first insulating layer 120a is disposed on the light-emitting stack S and then the first insulating layer 120a and the second insulating layer 120b are alternately and repeatedly stacked.

The first insulating layer 120a may include $SiO_2$, $MgF_2$, or $Al_2O_3$, and the second insulating layer 120b may include $ZrO_2$, $NbO_2$, $Ta_2O_3$, $TiO_2$, $CeO_2$, or $Si_3N_4$. However, the first insulating layer 120a and the second insulating layer 120b are not limited to the materials listed above, and any material can be used as long as the refractive index conditions and light transmittance characteristics are satisfied.

The first insulating layer 120a may have a thickness in the range of 1 nm to 96 nm, and the second insulating layer 120b may have a thickness in the range of 64 nm to 180 nm.

In some example embodiments, the first insulating layer 120a may include $SiO_2$, and the second insulating layer 120b may include $TiO_2$. In this case, the first insulating layer 120a may have a thickness in the range of 2 nm to 70 nm, and the second insulating layer 120b may have a thickness in the range of 105 nm to 135 nm.

The thickness ranges of the first and second insulating layers 120a and 120b may be designed by using, for example, simulation.

Figure 2A:
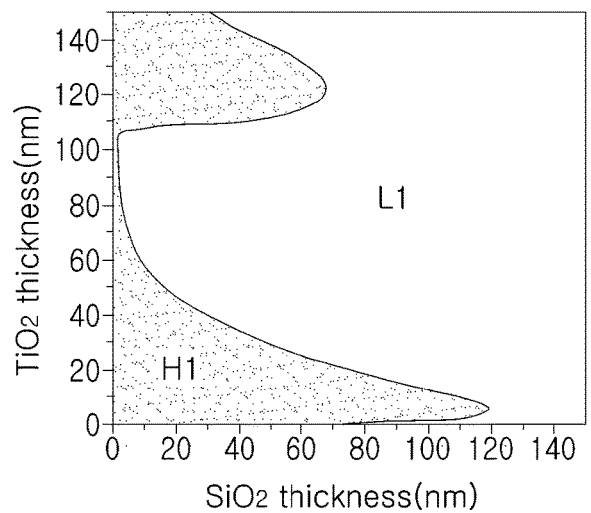
FIGS. 2A to 2C illustrate results of simulation of a semiconductor light-emitting device according to an example embodiment.
Figure 2B:
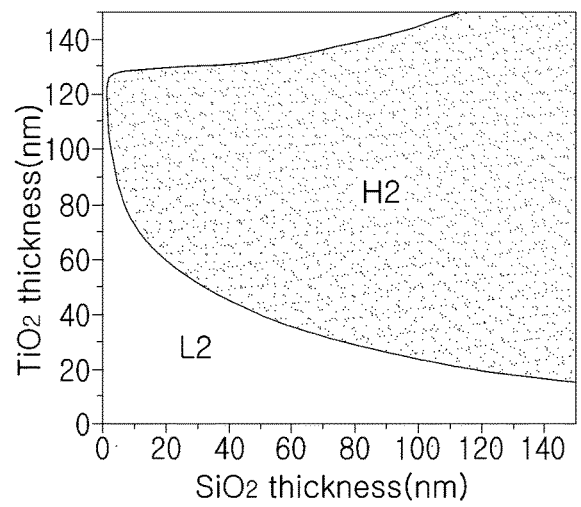
Figure 2C:
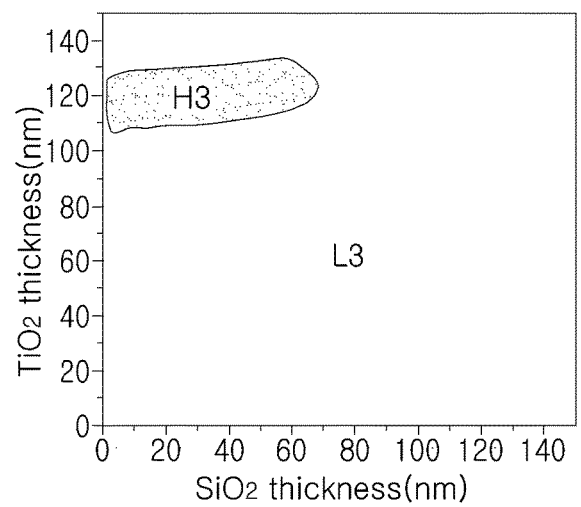

FIGS. 2A to 2C illustrate results of simulation of a semiconductor light-emitting device according to an example embodiment. Simulations of transmittance for blue light (a peak wavelength of 450 nm) and reflectance for green light (a peak wavelength of 535 nm or more) were executed on a semiconductor light-emitting device including a light control layer 120 having a $SiO_2/TiO_2$ double layer structure in comparison with a semiconductor light-emitting device not having the light control layer 120 having the $SiO_2/TiO_2$ double layer structure on the light-emitting stack S.

FIG. 2A illustrates a region H1 having high transmittance and a region L1 having low transmittance depending on the thicknesses of $SiO_2$ and $TiO_2$. FIG. 2B illustrates a region H2 having high reflectance and a region L2 having low reflectance depending on the thicknesses of $SiO_2$ and $TiO_2$. A region H3 having both high transmittance and high reflectance, that is, an overlapping region of the region H1 of FIG. 2A and the region H2 of FIG. 2B and a region L3, excluding the region H3, are illustrated in FIG. 2C. As illustrated in FIGS. 2A to 2C, when the $SiO_2$ layer has a thickness in the range of 2 nm to 70 nm and the $TiO_2$ layer has a thickness in the range of 105 nm to 135 nm, the semiconductor light-emitting device including the light control layer 120 having the $SiO_2/TiO_2$ double layer structure may have higher transmittance and higher reflectance than the semiconductor light-emitting device not having the light control layer 120 having the $SiO_2/TiO_2$ double layer structure.

By the above-described simulation, the thickness ranges of the first insulating layer 120a and the second insulating layer 120b may be determined in such a manner that the semiconductor light-emitting device including the light control layer 120 has higher transmittance and higher reflectance than the semiconductor light-emitting device not having the light control layer 120. Considering the combination of different materials satisfying the refractive index conditions, the thickness of the first insulating layer 120a may be in the range of 1 nm to 96 nm and the thickness of the second insulating layer 120b may be in the range of 64 nm to 180 nm.

In the semiconductor light-emitting device 10 illustrated in FIG. 1, the transparent electrode layer 134 may be further included between the light control layer 120 and the light-emitting stack S, more specifically, between the light control layer 120 and the first conductivity-type semiconductor layer 102. According to the example embodiment, the transparent electrode layer 134 may be selectively included. The transparent electrode layer 134 may form ohmic contact with the first conductivity-type semiconductor layer 102 and transmit light emitted from the light-emitting stack S. The transparent electrode layer 134 may include an ohmic contact material forming ohmic contact with the first conductivity-type semiconductor layer 102. The ohmic contact material may include at least one of Ag, Ni, Al, Rh, Pd, Ir, Ru, Mg, Zn, Pt, and Au, and may have a single layer structure or a multilayer structure. In addition, the transparent electrode layer 134 may be at least one of a transparent conductive material layer and a nitride layer. For example, the transparent electrode layer 134 may be at least one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). In an example embodiment, the transparent electrode layer 134 may include graphene.

The first electrode 150 disposed on the transparent electrode layer 134 may include Ag, Ni, Al, Cr, Rh, Pd, Jr, Ru, Mg, Zn, Pt, Au, or the like, and may have a single layer structure or a multilayer structure.

The light control layer 120 may be applied to chip structures of various semiconductor light-emitting devices according to the example embodiments.

Figure 3:
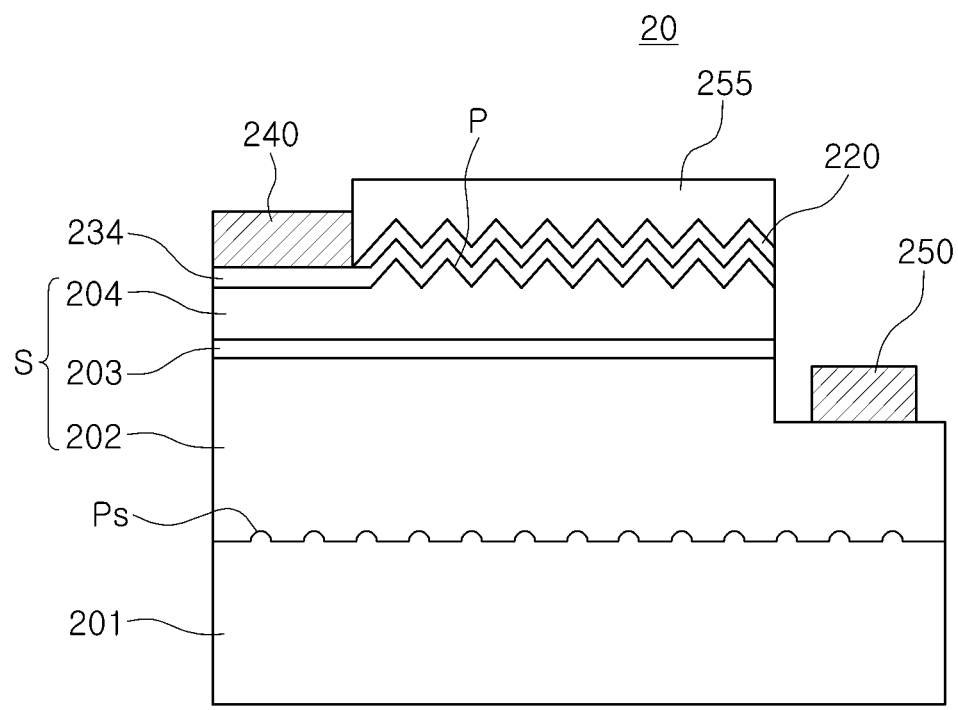
FIGS. 3 to 8 are cross-sectional views of a semiconductor light-emitting device according to example embodiments.

FIG. 3 is a cross-sectional view of a semiconductor light-emitting device according to an example embodiment.

A semiconductor light-emitting device 20 illustrated in FIG. 3 may include a growth substrate 201, a light-emitting stack S, a light control layer 220, and a wavelength conversion layer 255. The semiconductor light-emitting device 20 may include a transparent electrode layer 234, a first electrode 250, and a second electrode 240.

The growth substrate 201 may be sapphire, SiC, Si, $MgAl_2O_4$, MgO, $LiAlO_2$, $LiGaO_2$, or GaN. An uneven pattern Ps may be formed on an upper surface of the growth substrate 201. The uneven pattern Ps may be used to improve light extraction efficiency and improve quality of a single crystal to be grown thereon.

The light-emitting stack S may include a first conductivity-type semiconductor layer 202, an active layer 203, and a second conductivity-type semiconductor layer 204, sequentially disposed on the growth substrate 201. A buffer layer may be disposed between the growth substrate 201 and the first conductivity-type semiconductor layer 202.

The buffer layer may be $In_xAl_yGa_{1-x-y}N$ ($0 \leq x \leq 1$ and $0 \leq y \leq 1$). For example, the buffer layer may be formed at a low temperature in a range of 500° C. to 600° C., and may be GaN, AlN, AlGaN, or InGaN, which is not intentionally doped. In an example embodiment, the buffer layer may be formed by combining a plurality of layers or may have a gradated composition.

The first conductivity-type semiconductor layer 202 may be a nitride semiconductor satisfying n-type $In_xAl_yGa_{1-x-y}N$ ($0 \leq x \leq 1$, $0 \leq y \leq 1$, and $0 \leq x+y < 1$), and the n-type impurities may be Si. The second conductivity-type semiconductor layer 204 may be a nitride semiconductor layer satisfying p-type $In_xAl_yGa_{1-x-y}N$ ($0 \leq x < 1$, $0 \leq y < 1$, and $0 \leq x+y < 1$), and the p-type impurities may be Mg. The active layer 203 may have an MQW structure in which quantum well layers and quantum barrier layers are alternately stacked. For example, the quantum well layers and the quantum barrier layers may be $In_xAl_yGa_{1-x-y}N$ ($0 \leq x \leq 1$, $0 \leq y \leq 1$, and $0 \leq x+y \leq 1$) layers having different compositions. In some example embodiments, the quantum well layers may be $In_xGa_{1-x}N$ ($0 < x \leq 1$), and the quantum barrier layers may be GaN or AlGaN.

The first and second electrodes 250 and 240 may be disposed on a mesa-etched area of the first conductivity-type semiconductor layer 202 and on the second conductivity-type semiconductor layer 204, respectively, so as to be positioned on the same side. For example, the first electrode 250 may include Ag, Ni, Al, Cr, Rh, Pd, Jr, Ru, Mg, Zn, Pt, or Au, and may have a single layer structure or a multilayer structure. The second electrode 240 may include at least one of Al, Au, Cr, Ni, Ti, and Sn.

The light control layer 220 may be interposed between the wavelength conversion layer 255 and the second conductivity-type semiconductor layer 204. According to an example embodiment, an uneven structure P may be selectively formed on an upper surface of the second conductivity-type semiconductor layer 204. In some example embodiments, the uneven structure P may not be formed on the upper surface of the second conductivity-type semiconductor layer 204. A transparent electrode layer 234 may be disposed between the second conductivity-type semiconductor layer 204 and the light control layer 220.

The light control layer 220 and the transparent electrode layer 234 may respectively include the same material as the light control layer 120 and the transparent electrode layer 134, described with reference to FIG. 1.

Figure 4:
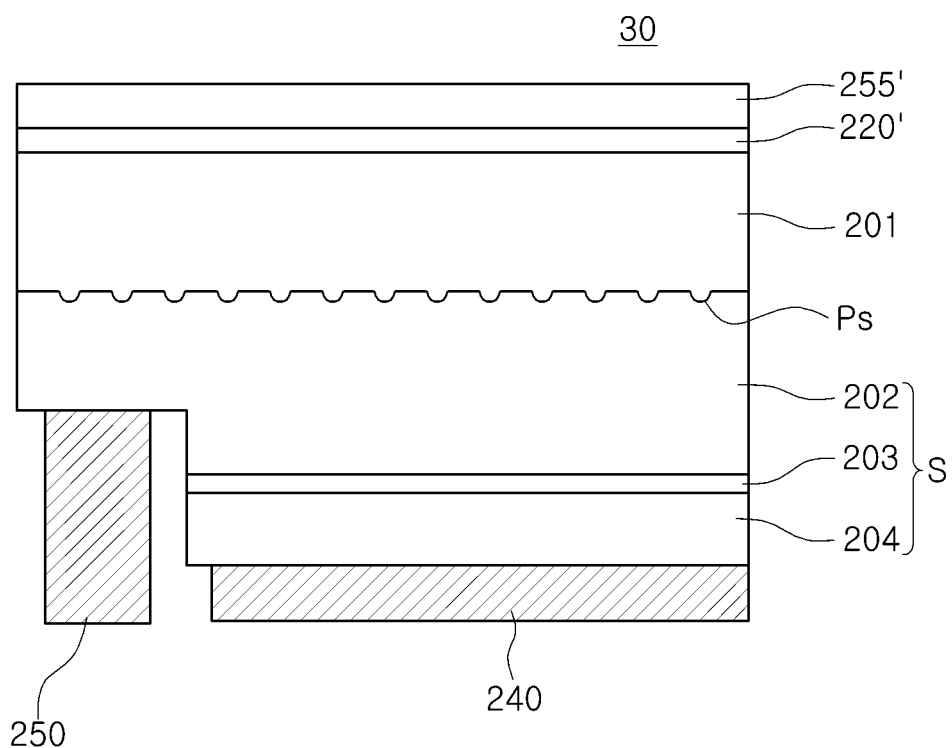

FIG. 4 is a cross-sectional view of a semiconductor light-emitting device according to another example embodiment.

The semiconductor light-emitting device 30 illustrated in FIG. 4 may include a light-transmissive substrate 201, a light-emitting stack S, a light control layer 220', and a wavelength conversion layer 255'. The semiconductor light-emitting device 30 may include a first electrode 250 and a second electrode 240.

The light-transmissive substrate 201 may provide a main light extraction surface. The light-transmissive substrate 201 may be an insulating substrate such as sapphire, but is not limited thereto. For example, the light-transmissive substrate 201 may be a conductive or semiconductive substrate having a light transmittance characteristic. An uneven pattern Ps may be formed on the substrate 201. The uneven pattern Ps may be used to improve light extraction efficiency and improve quality of a single crystal to be grown thereon.

The light-emitting stack S may include a first conductivity-type semiconductor layer 202, an active layer 203, and a second conductivity-type semiconductor layer 204, sequentially disposed on the light-transmissive substrate 201. A buffer layer may be disposed between the light-transmissive substrate 201 and the first conductivity-type semiconductor layer 202.

The light control layer 220', unlike the light control layer 220 illustrated in FIG. 3, may be disposed between the light-transmissive substrate 201 and the wavelength conversion layer 255'. The light control layer 220' may include the same material as the light control layer 120 described with reference to FIG. 1.

The first electrode 250 may include Ag, Ni, Al, Cr, Rh, Pd, Jr, Ru, Mg, Zn, Pt, Au, or the like, and may have a single layer structure or a multilayer structure.

The second electrode 240 may have a reflective electrode structure. The second electrode 240 may include Ag, Ni, Al, Rh, Pd, Jr, Ru, Mg, Zn, Pt, Au, Sn, or the like, and may have a multilayer structure, such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

Figure 5:
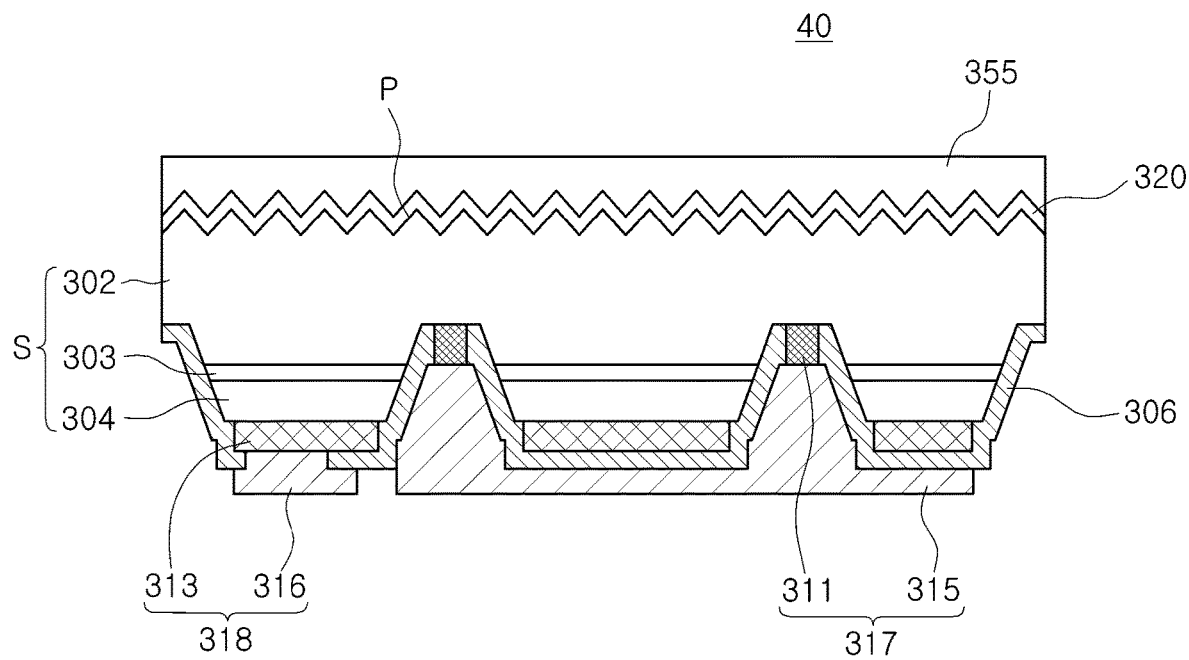

FIG. 5 is a cross-sectional view of a semiconductor light-emitting device according to still another example embodiment.

Referring to FIG. 5, a semiconductor light-emitting device 40 according to the example embodiment may include a light-emitting stack S in which a first conductivity-type semiconductor layer 302, an active layer 303, and a second conductivity-type semiconductor layer 304 are sequentially stacked, and an uneven structure P formed on a surface of the first conductivity-type semiconductor layer 302 providing a main light-emitting surface. The semiconductor light-emitting device 40 may further include a light control layer 320 and a wavelength conversion layer 355, disposed on the uneven structure P. The light control layer 320 may include the same material as the light control layer 120 described with reference to FIG. 1.

In addition, the semiconductor light-emitting device 40 may further include a first electrode 317 connected to the first conductivity-type semiconductor layer 302, and a second electrode 318 connected to the second conductivity-type semiconductor layer 304.

The light-emitting stack S may include a Group III nitride semiconductor. The first conductivity-type semiconductor layer 302 may be a nitride semiconductor satisfying n-type $Al_xIn_yGa_{1-x-y}N$ ($0 \le x<1$, $0 \le y<1$, and $0 \le x+y<1$), and the n-type impurities may be Si. For example, the first conductivity-type semiconductor layer 302 may be n-type GaN. The active layer 303 may emit light having a predetermined wavelength through a recombination of an electron and a hole, and may have an MQW structure in which quantum well layers and quantum barrier layers are alternately stacked. For example, the active layer 303 may have a GaN/InGaN structure. Alternatively, the active layer 303 may have a single-quantum well (SQW) structure. The second conductivity-type semiconductor layer 304 may be a nitride semiconductor layer satisfying p-type $Al_xIn_yGa_{1-x-y}N$ ($0 \le x<1$, $0 \le y<1$, and $0 \le x+y<1$), and the p-type impurities may be Mg. For example, the second conductivity-type semiconductor layer 304 may be p-type GaN.

To reduce electrons overflowing into the second conductivity-type semiconductor layer 304, an electron blocking layer may be disposed between the active layer 303 and the second conductivity-type semiconductor layer 304. The electron blocking layer may have a greater energy bandgap than the last quantum barrier layer of the active layer 303. For example, the electron blocking layer may include $Al_rGa_{1-r}N$ ($0<r \le 1$).

The first electrode 317 may pass through the second conductivity-type semiconductor layer 304 and the active layer 303 to be connected to the first conductivity-type semiconductor layer 302, and the first electrode 317 may have at least one first contact area provided by at least one hole passing through the second conductivity-type semiconductor layer 304 and the active layer 303 and exposing a portion of the first conductivity-type semiconductor layer 302. The first contact area may refer to an area in which the first conductivity-type semiconductor layer 302 is in contact with a first contact electrode 311. The first electrode 317 may include the first contact electrode 311 disposed in the first contact area and a first pad electrode 315 connected to the first contact electrode 311. A plurality of first contact electrodes 311 may be disposed to reduce contact resistance with the first conductivity-type semiconductor layer 302 and spread currents of the light-emitting device. The number of first contact electrodes 311 is not limited thereto.

The second electrode 318 may include a second contact electrode 313 disposed in a second contact area of the second conductivity-type semiconductor layer 304 and a second pad electrode 316 connected to the second contact electrode 313. The second contact area may refer to an area in which the second conductivity-type semiconductor layer 304 is in contact with the second contact electrode 313. The second contact electrode 313 may include one connected conductive layer.

The first contact electrode 311 may include a material forming ohmic contact with the first conductivity-type semiconductor layer 302. The first contact electrode 311 may include, but is not limited to, Ag, Ni, Al, Rh, Pd, Ir, Ru, Mg, Zn, Pt, or Au, and may have a single layer structure or a multilayer structure. For example, the first contact electrode 311 may include Cr/Au or Cr/Au/Pt. In an example embodiment, a barrier layer may be additionally formed on the first contact electrode 311. The second contact electrode 313 may include a material forming ohmic contact with the second conductivity-type semiconductor layer 304. For example, the second contact electrode 313 may include Ag or Ag/Ni. In an example embodiment, a barrier layer may be additionally formed on the second contact electrode 313. The barrier layer may be at least one selected from the group consisting of Ni, Al, Cu, Cr, Ti, and a combination thereof. The first and second pad electrodes 315 and 316 may include Ag, Ni, Al, Rh, Pd, Jr, Ru, Mg, Zn, Pt, or Au, and may have a single layer structure or a multilayer structure.

The first electrode 317 and the second electrode 318 may be electrically separated from each other by a passivation layer 306. The passivation layer 306 may include a first insulating layer and a second insulating layer, and the first and second insulating layers may include $SiO_2$, SiN, or SiON.

Figure 6:
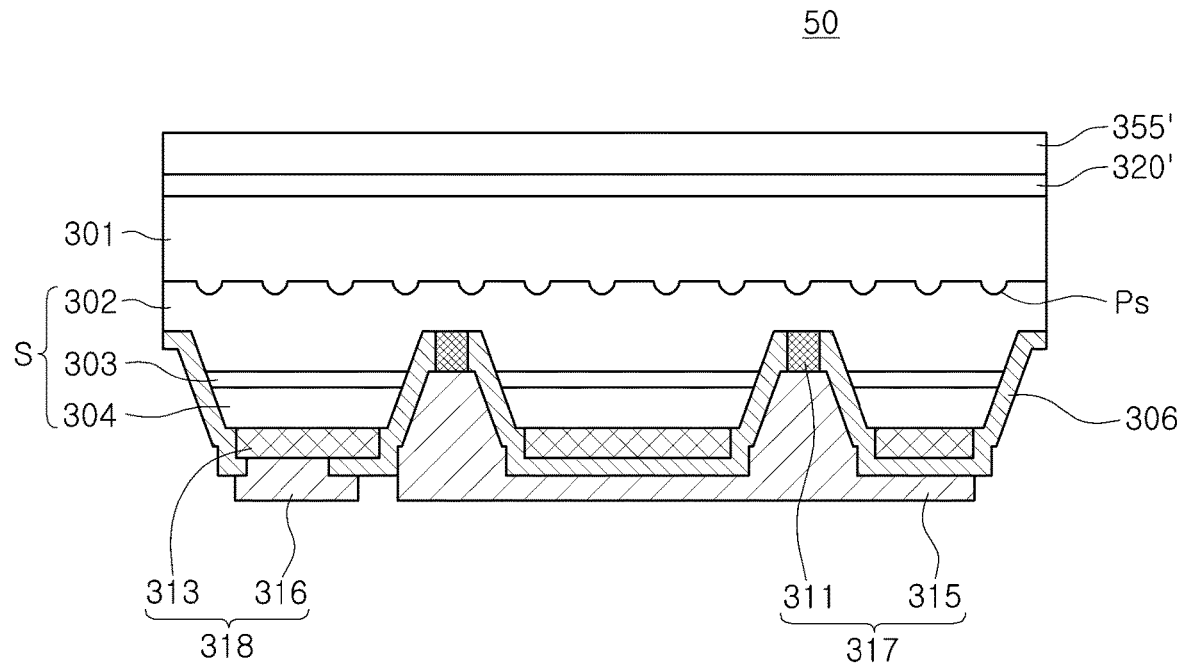

FIG. 6 is a cross-sectional view of a semiconductor light-emitting device according to still another example embodiment.

A semiconductor light-emitting device 50 illustrated in FIG. 6 may include a light transmissive substrate 301, a light-emitting stack S, a light control layer 320', and a wavelength conversion layer 355'. The semiconductor light-emitting device 50 may include first and second electrodes 317 and 318.

The light transmissive substrate 301 may provide a main light extraction layer. The light transmissive substrate 301 may be an insulating substrate such as sapphire, but is not limited thereto. For example, the light transmissive substrate 301 may be a conductive or semiconductive substrate having a light transmittance characteristic. Uneven pattern Ps may be formed on the light transmissive substrate 301. The uneven pattern Ps may be used to improve light extraction efficiency and, at the same time, improve crystal quality of the light-emitting stack S to be grown thereon.

The light-emitting stack S may include a first conductivity-type semiconductor layer 302, an active layer 303, and a second conductivity-type semiconductor layer 304, sequentially disposed on the light transmissive substrate 301. A buffer layer may be disposed between the light transmissive substrate 301 and the first conductivity-type semiconductor layer 302.

The first electrode 317 passes through the second conductivity-type semiconductor layer 304 and the active layer 303 to be connected to the first conductivity-type semiconductor layer 302 and the second electrode 318 is connected to the second conductivity-type semiconductor layer 304.

The light control layer 320' may be disposed between the light transmissive substrate 301 and the wavelength conversion layer 355', unlike the light control layer 320 described with reference to FIG. 5. The light control layer 320' may include the light control layer 120 described with reference to FIG. 1.

Figure 7:
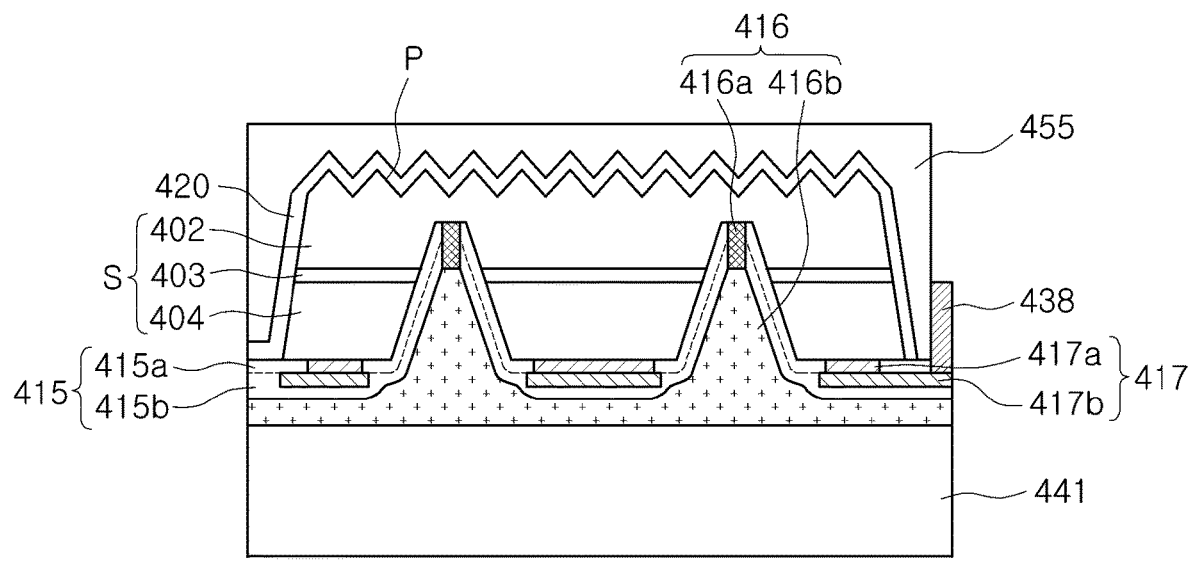

FIG. 7 is a cross-sectional view of a semiconductor light-emitting device according to still another example embodiment.

Referring to FIG. 7, a semiconductor light-emitting device 60 according to an example embodiment may include a light-emitting stack S in which a first conductivity-type semiconductor layer 402, an active layer 403, and a second conductivity-type semiconductor layer 404 are sequentially stacked, and an uneven structure P formed on a surface of the first conductivity-type semiconductor layer 402 providing a main light-emitting surface. The semiconductor light-emitting device 60 may further include a light control layer 420 and a wavelength conversion layer 455, disposed on the uneven structure P. The light control layer 420 and the wavelength conversion layer 455 may cover a side surface of the light-emitting stack S. The light control layer 420 may include the same material as the light control layer 120 described with reference to FIG. 1.

In addition, the semiconductor light-emitting device 60 according to the example embodiment may further include a first electrode 416 connected to the first conductivity-type semiconductor layer 402, a support substrate 441 connected to the first electrode 416, a second electrode 417 connected to the second conductivity-type semiconductor layer 404, and a bonding electrode 438 connected to the second electrode 417.

The light-emitting stack S may include a Group III nitride semiconductor. The first conductivity-type semiconductor layer 402 may be a nitride semiconductor satisfying n-type $Al_xIn_yGa_{1-x-y}N$ ($0 \leq x<1$, $0 \leq y<1$, and $0 \leq x+y<1$), and the n-type impurities may be Si. For example, the first conductivity-type semiconductor layer 402 may be n-type GaN. The active layer 403 may emit light having a predetermined wavelength through a recombination of an electron and a hole, and may have an MQW structure in which quantum well layers and quantum barrier layers are alternately stacked. For example, the active layer 403 may have a GaN/InGaN structure. Alternatively, the active layer 403 may have an SQW structure. The second conductivity-type semiconductor layer 404 may be a nitride semiconductor layer satisfying p-type $Al_xIn_yGa_{1-x-y}N$ ($0 \leq x<1$, $0 \leq y<1$, and $0 \leq x+y<1$), and the p-type impurities may be Mg. For example, the second conductivity-type semiconductor layer 404 may be p-type GaN.

To reduce electrons overflowing into the second conductivity-type semiconductor layer 404, an electron blocking layer may be disposed between the active layer 403 and the second conductivity-type semiconductor layer 404. The electron blocking layer may have a greater energy bandgap than the last quantum barrier layer of the active layer 403. For example, the electron blocking layer may include $Al_rGa_{1-r}N$ ($0<r \leq 1$).

The first electrode 416 may pass through the second conductivity-type semiconductor layer 404 and the active layer 403 to be connected to the first conductivity-type semiconductor layer 402, and the first electrode 416 may have at least one first contact area provided by at least one hole passing through the second conductivity-type semiconductor layer 404 and the active layer 403 and exposing a portion of the first conductivity-type semiconductor layer 402. The first contact area may refer to an area in which the first conductivity-type semiconductor layer 402 is in contact with a first contact electrode 416a. The first electrode 416 may include the first contact electrode 416a disposed in the first contact area and a first connection electrode 416b connected to the first contact electrode 416a. A plurality of first contact electrodes 416a may be disposed to reduce contact resistance with the first conductivity-type semiconductor layer 402 and spread currents of the light-emitting device. The number of first contact electrode 416a is not limited thereto.

The second electrode 417 may include a second contact electrode 417a disposed in a second contact area of the second conductivity-type semiconductor layer 404 and a second connection electrode 417b connected to the second contact electrode 417a. The second contact area may refer to an area in which the second conductivity-type semiconductor layer 404 is in contact with the second contact electrode 417a. The second contact electrode 417a may include one connected conductive layer.

The first contact electrode 416a may include a material forming ohmic contact with the first conductivity-type semiconductor layer 402. The first contact electrode 416a may include, but is not limited to, Ag, Ni, Al, Rh, Pd, Ir, Ru, Mg, Zn, Pt, or Au, and may have a single layer structure or a multilayer structure. For example, the first contact electrode 416a may include Cr/Au or Cr/Au/Pt. In an example embodiment, a barrier layer may be additionally formed on the first contact electrode 416a. The second contact electrode 417a may include a material forming ohmic contact with the second conductivity-type semiconductor layer 404. For example, the second contact electrode 417a may include Ag or Ag/Ni. In an example embodiment, a barrier layer may be additionally formed on the second contact electrode 417a. The barrier layer may be at least one selected from the group consisting of Ni, Al, Cu, Cr, Ti, and a combination thereof. The first and second connection electrodes 416b and 417b may include Ag, Ni, Al, Rh, Pd, Jr, Ru, Mg, Zn, Pt, or Au, and may have a single layer structure or a multilayer structure.

The first electrode 416 and the second electrode 417 may be electrically separated from each other by a passivation layer 415. The passivation layer 415 may include a first insulating layer 415a and a second insulating layer 415b, and the first and second insulating layers 415a and 415b may include $SiO_2$, SiN, or SiON.

The support substrate 441 connected to the first electrode 416 may be a conductive substrate, and may be bonded to (or disposed on) the first electrode 416 by a bonding metal layer. The support substrate 441 may include one of Au, Ni, Al, Cu, W, Si, SiAl, and GaAs.

Figure 8:
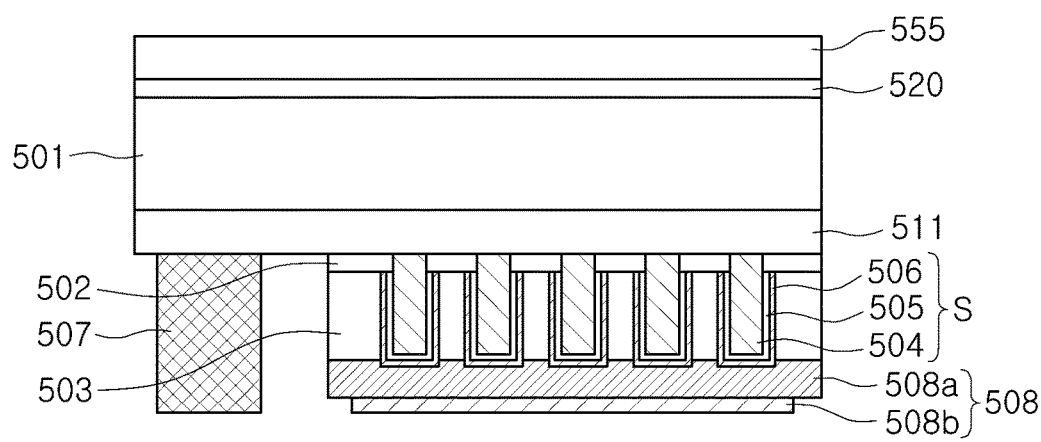

FIG. 8 is a cross-sectional view of a semiconductor light-emitting device according to still another example embodiment.

The semiconductor light-emitting device 70 illustrated in FIG. 8 may include a light transmissive substrate 501, a first conductivity-type base layer 511 formed on a first surface of the light transmissive substrate 501, and a plurality of light-emitting nanostructures S' formed on the base layer 511. In addition, the semiconductor light-emitting device 70 may include a light control layer 520 formed on a second surface of the light transmissive substrate 501 provided as a light-emitting surface, and a wavelength conversion layer 555 disposed on the light control layer 520. The light control layer 520 may include the same material as the light control layer 120 described with reference to FIG. 1.

In addition, the semiconductor light-emitting device 70 may further include a first conductivity-type semiconductor base layer 511, an insulating layer 502, a filling layer 503, a first electrode 507, and a second electrode 508.

The light transmissive substrate 501 may provide a main light extraction surface. The light transmissive substrate 501 may be an insulating substrate such as sapphire, but is not limited thereto. For example, the light transmissive substrate 501 may be a conductive or semiconductive substrate having a light transmittance characteristic.

The light-emitting nanostructures S' may include first conductivity-type semiconductor nanocores 504, and active layers 505 and second conductivity-type semiconductor layers 506, sequentially formed as shell layers on surfaces of the nanocores 504.

In the example embodiments of FIG. 8, the light-emitting nanostructures S' may have, for example, a rod-shaped core-shell structure, but are not limited thereto. The light-emitting nanostructures S' may have another structure such as, for example, a pyramid shape. The first conductivity-type semiconductor base layer 511 may be a layer providing a crystal surface for growing the first conductivity-type semiconductor nanocores 504. The insulating layer 502 may provide open areas for growing the first conductivity-type semiconductor nanocores 504, and may be a dielectric material, such as $SiO_2$ or $SiN_x$.

The filling layer 503 may be used to structurally protect the light-emitting nanostructures S', and transmit or reflect light. When the filling layer 503 includes a light transmissive material, the filling layer 503 may include a transparent material, such as $SiO_2$, $SiN_x$, silicone, epoxy resin, polymers, or plastics. In an example embodiment, when the filling layer 503 includes a reflective material, the filling layer 503 may include a polymer material in which metal powder or ceramic powder having high reflectance is dispersed, such as polyphthalamide (PPA). As the ceramic powder having high reflectance, at least one selected from the group consisting of $TiO_2$, $Al_2O_3$, $Nb_2O_5$, $Al_2O_3$, and ZnO, may be used. As the metal powder having high reflectance, a metal powder such as Al powder or Ag powder may be used.

The first and second electrodes 507 and 508 may be disposed on lower surfaces of the light-emitting nanostructures S'. The first electrode 507 may be disposed on an exposed lower surface of the first conductivity-type semiconductor base layer 511, and the second electrode 508 may include a reflective ohmic contact layer 508a and an electrode pad 508b, formed below the light-emitting nanostructures S' and the filling layer 503.

Figure 9:
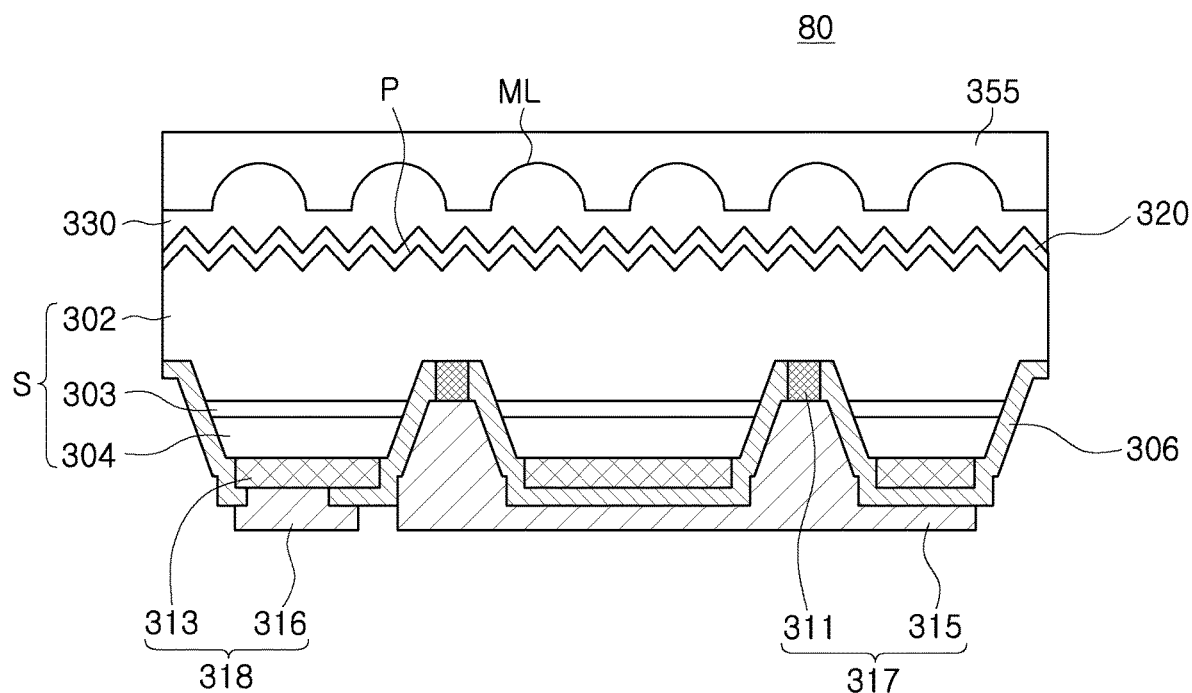
FIGS. 9 and 10 are cross-sectional views of semiconductor light emitting devices according to example embodiments.
Figure 10:
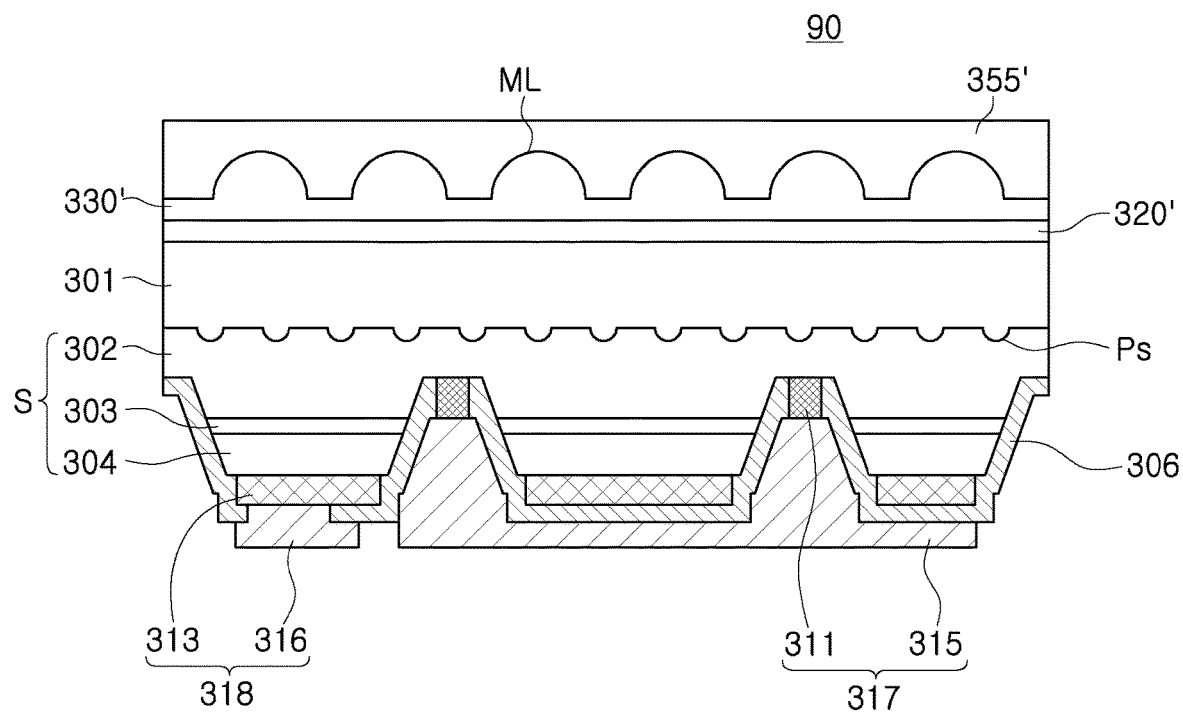

FIGS. 9 and 10 are cross-sectional views of semiconductor light emitting devices according to example embodiments.

With reference to FIG. 9, a semiconductor light emitting device 80 may further include a micro lens unit (or micro lens portion) 330 disposed between a light control layer 320 and a wavelength conversion layer 355 in a manner different from the semiconductor light emitting device 40 illustrated in FIG. 5.

The micro lens unit 330 disposed on the light control layer 320 may include protrusion portions ML having a convex curvature being convex toward the wavelength conversion layer 355. The protrusion portions ML may be disposed on a surface of the micro lens portion 330 while forming an array arranged in intervals. The protrusion portions ML forming an array may be referred to as a micro lens array. As the protrusion portions ML have a convex curvature, an amount of light incident to an inner portion of the wavelength conversion layer 355 may be increased. The protrusion portions ML may be formed of a size of several um. In order to reduce total reflection by a difference between refractive indices, a refractive index of the micro lens portion 330 may be lower than that of a light-emitting stack S and may be higher than that of the wavelength conversion layer 355.

The micro lens unit 330 employed in the example embodiment may improve extraction efficiency of light emitted by a light emitting stack S.

With reference to FIG. 10, a semiconductor light emitting device 90 may further include a micro lens unit 330' disposed between a light control layer 320' and a wavelength conversion layer 355' in a manner different from the semiconductor light emitting device 50 illustrated in FIG. 6.

The micro lens unit 330' disposed on the light control layer 320' may include protrusion portions ML having a convex curvature being convex toward the wavelength conversion layer 355'. The protrusion portions ML may be disposed on a surface of the micro lens unit 330' while forming an array arranged in intervals. The protrusion portions ML forming an array may be referred to as a micro lens array. As the protrusion portions ML have a convex curvature, an amount of light incident to an inner portion of the wavelength conversion layer 355' may be increased. The protrusion portions ML may be formed of a size of several um. In order to reduce total reflection by a difference between refractive indices, a refractive index of the micro lens unit 330' may be lower than that of a light-emitting stack S and may be higher than that of the wavelength conversion layer 355'.

The micro lens unit 330' employed in the example embodiment may improve extraction efficiency of light emitted from a light emitting stack S.

The micro lens units 330 and 330' employed in FIGS. 9 and 10 may also be used in other example embodiments of FIGS. 1, 3, 4 and 7.

Figure 11:
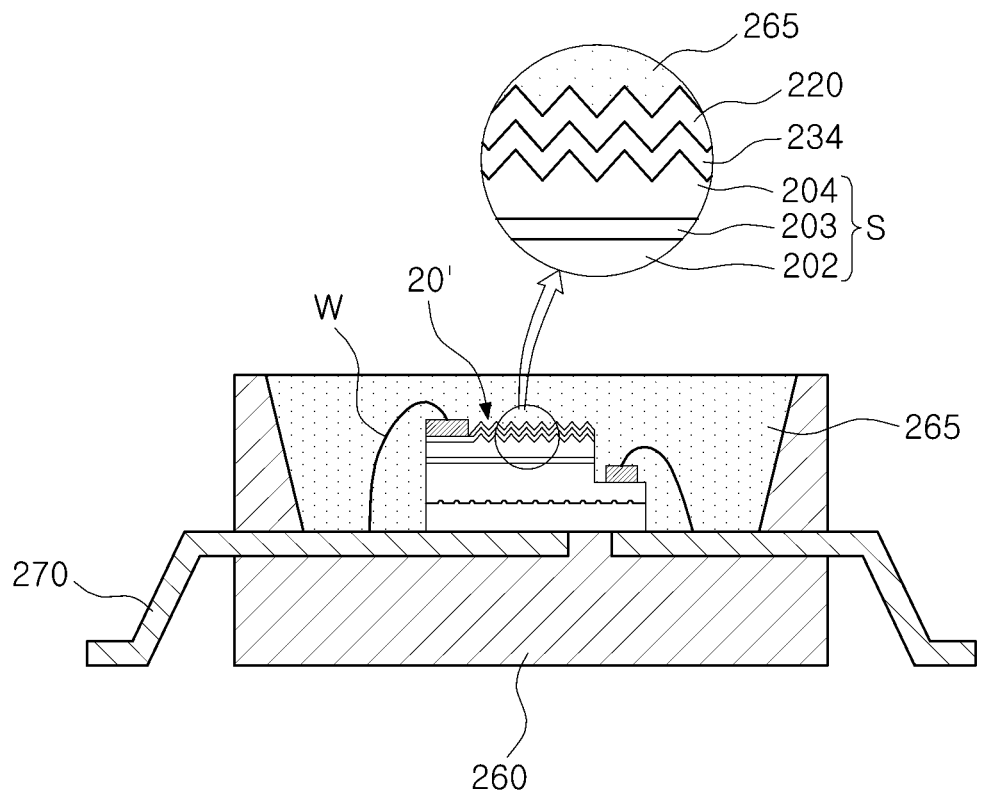
FIGS. 11 and 12 are cross-sectional views illustrating semiconductor light-emitting device packages including semiconductor light-emitting devices according to an example embodiment.

FIG. 11 is a cross-sectional view illustrating a semiconductor light-emitting device package including a semiconductor light-emitting device according to an example embodiment.

In the semiconductor light-emitting device package illustrated in FIG. 11, a semiconductor light-emitting device 20' is mounted. The semiconductor light-emitting device 20' has the same structure as the semiconductor light-emitting device 20 illustrated in FIG. 3, except that the wavelength conversion layer 255 is not provided in the semiconductor light-emitting device 20'. In some example embodiments, unlike FIG. 11, an uneven structure may not be formed on an upper surface of the second conductivity-type semiconductor layer 204.

Referring to FIG. 11, the semiconductor light-emitting device 20' may be mounted on a lead frame 270, and each electrode thereof may be electrically connected to the lead frame 270 by a wire W. In an example embodiment, the semiconductor light-emitting device 20' may be mounted on another portion of the semiconductor light-emitting device package other than the lead frame 270, for example, on a package body 260. In addition, the package body 260 may have a cup-shaped groove to improve light-reflecting efficiency, and an encapsulant 265 including a light transmissive material may be formed on the groove, to encapsulate the semiconductor light-emitting device 20' and the wire W. The encapsulant 265 may include a wavelength conversion material, such as a phosphor and/or quantum dots. The wavelength-converting material will be further described in detail later.

The light control layer 220 may be used to improve transmittance of light emitted from the light-emitting stack S, and improve reflectance of light, a wavelength of which is converted by the phosphor in the encapsulant 265 and re-incident to the light-emitting stack S.

In an example embodiment, the micro lens unit 330 described above with reference to FIG. 9 may be further disposed on the light control layer 220.

Figure 12:
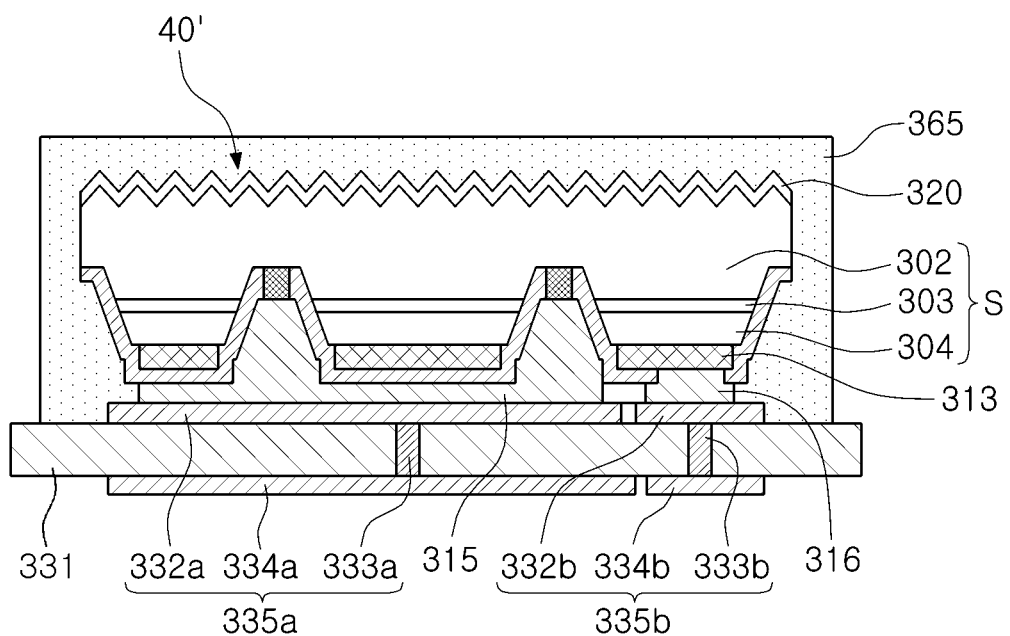

FIG. 12 is a cross-sectional view illustrating a semiconductor light-emitting device package including a flip-chip type semiconductor light-emitting device according to an example embodiment.

The package illustrated in FIG. 12 includes a circuit board 331 and a semiconductor light-emitting device 40' mounted on the circuit board 331. The semiconductor light-emitting device 40' may have the same structure as the semiconductor light-emitting device 40 illustrated in FIG. 5, except that the wavelength conversion layer 355 is not provided in the semiconductor light-emitting device 40'.

The circuit board 331 may include first and second interconnection electrodes 335a and 335b. The first and second interconnection electrodes 335a and 335b may respectively include first and second upper electrodes 332a and 332b disposed on an upper surface of the circuit board 331, first and second lower electrodes 334a and 334b disposed on a lower surface of the circuit board 331, a first through-electrode 333a connecting the first upper electrode 332a to the first lower electrode 334a, and a second through-electrode 333b connecting the second upper electrode 332b to the second lower electrode 334b. The circuit board 331 described in the example embodiment is merely illustrative, and may be applied in various forms. For example, the circuit board 331 may be a printed circuit board (PCB) substrate such as a metal core PCB (MCPCB), a metal base PCB (MPCB), or a flexible PCB (FPCB), or a ceramic substrate such as AlN and $Al_2O_3$, and may be provided as a substrate on which lead frames are fixed.

The semiconductor light-emitting device 40' may be mounted on the circuit board 331 in a flip-chip bonding method. That is, the semiconductor light-emitting device 40' may be mounted on the circuit board 331 in such a manner that the first and second pad electrodes 315 and 316 face the circuit board 331. The first and second pad electrodes 315 and 316 may include a bonding layer, such as a eutectic metal layer, thereon, and may be bonded to (or disposed on) the first and second upper electrodes 332a and 332b using the bonding layer. Alternatively, an additional bonding layer such as a eutectic metal layer or a conductive epoxy may be used to respectively bond the first and second pad electrodes 315 and 316 and the first and second upper electrodes 332a and 332b.

As illustrated in FIG. 12, a wavelength conversion layer 365 converting a wavelength of light emitted from the active layer 303 to a different wavelength may be disposed on a surface of the semiconductor light-emitting device 40'. The wavelength conversion layer 365 employed in the example embodiment may be a resin layer including a wavelength-converting material, such as a phosphor or quantum dots. The wavelength-converting material will be described in detail later.

The light control layer 320 may be used to improve transmittance of light emitted from the light-emitting stack S, and improve reflectance of light, a wavelength of which is converted by the phosphor in the wavelength conversion layer 365 and re-incident to the light-emitting stack S.

In an example embodiment, the micro lens unit 330 described above with reference to FIG. 9 may be further disposed on the light control layer 320.

Figure 13A:
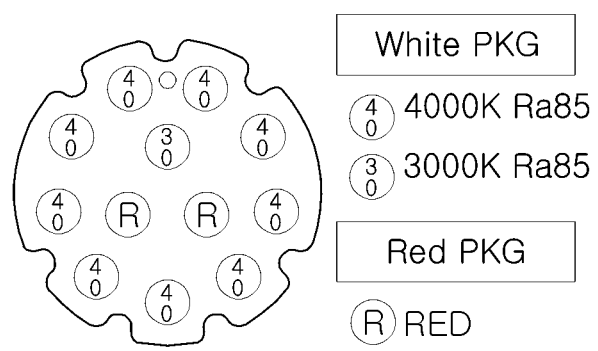
FIGS. 13A and 13B are schematic diagrams illustrating a white light source module employing a semiconductor light-emitting device package according to an example embodiment.
Figure 13B:
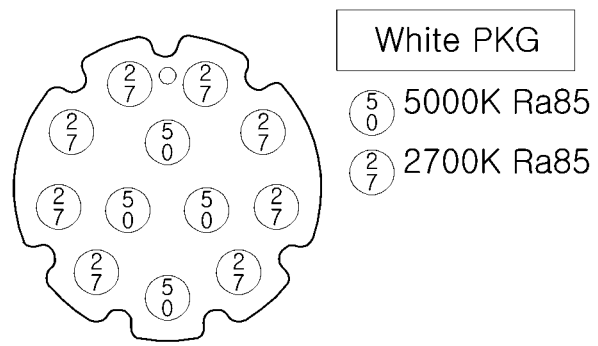

FIGS. 13A and 13B are schematic diagrams illustrating a white light source module employing a semiconductor light-emitting device package according to an example embodiment.

Referring to FIGS. 13A and 13B, the light source module may include a plurality of light-emitting device packages, each of which is mounted on a circuit board. The plurality of light-emitting device packages mounted on a single light source module may be configured with the same type packages generating light of the same wavelength, or as illustrated in the example embodiment, may be configured with different types of packages generating light of different wavelengths.

Referring to FIG. 13A, the white light source module may be formed by combining a white light-emitting device package having a color temperature of 4,000 K and a red light-emitting device package having a color temperature of 3,000 K. The white light source module may provide white light having a color temperature controlled within the range of 3,000 K to 4,000 K and a color rendering index Ra in the range of 85 to 100.

Referring to FIG. 13B, the white light source module may be formed with white light-emitting device packages, some of which may emit white light having a different color temperature. For example, by combining a white light-emitting device package having a color temperature of 2,700 K and a white light-emitting device package having a color temperature of 5,000 K, white light having a color temperature controlled in the range of 2,700 K to 5,000 K and a color rendering index Ra in the range of 85 to 99 may be provided.

Here, the number of light-emitting device packages having a certain color temperature may be changed, for example, depending on a set value of a default color temperature. For example, when a set value of a default color temperature of a lighting apparatus is about 4,000 K, the number of light-emitting device packages corresponding to the color temperature of 4,000 K may be greater than the number of light-emitting device packages corresponding to a color temperature of 3,000 K or the number of the red light-emitting device packages.

In this manner, the color temperature and the color rendering index (hereinafter, CRI) of white light may be controlled by configuring a heterogeneous light-emitting device package, which includes a light-emitting device emitting white light, which is produced by combining a yellow, green, red, or orange phosphor with a blue light-emitting device, and at least one of violet, blue, green, red, and infrared light-emitting devices.

Figure 22:
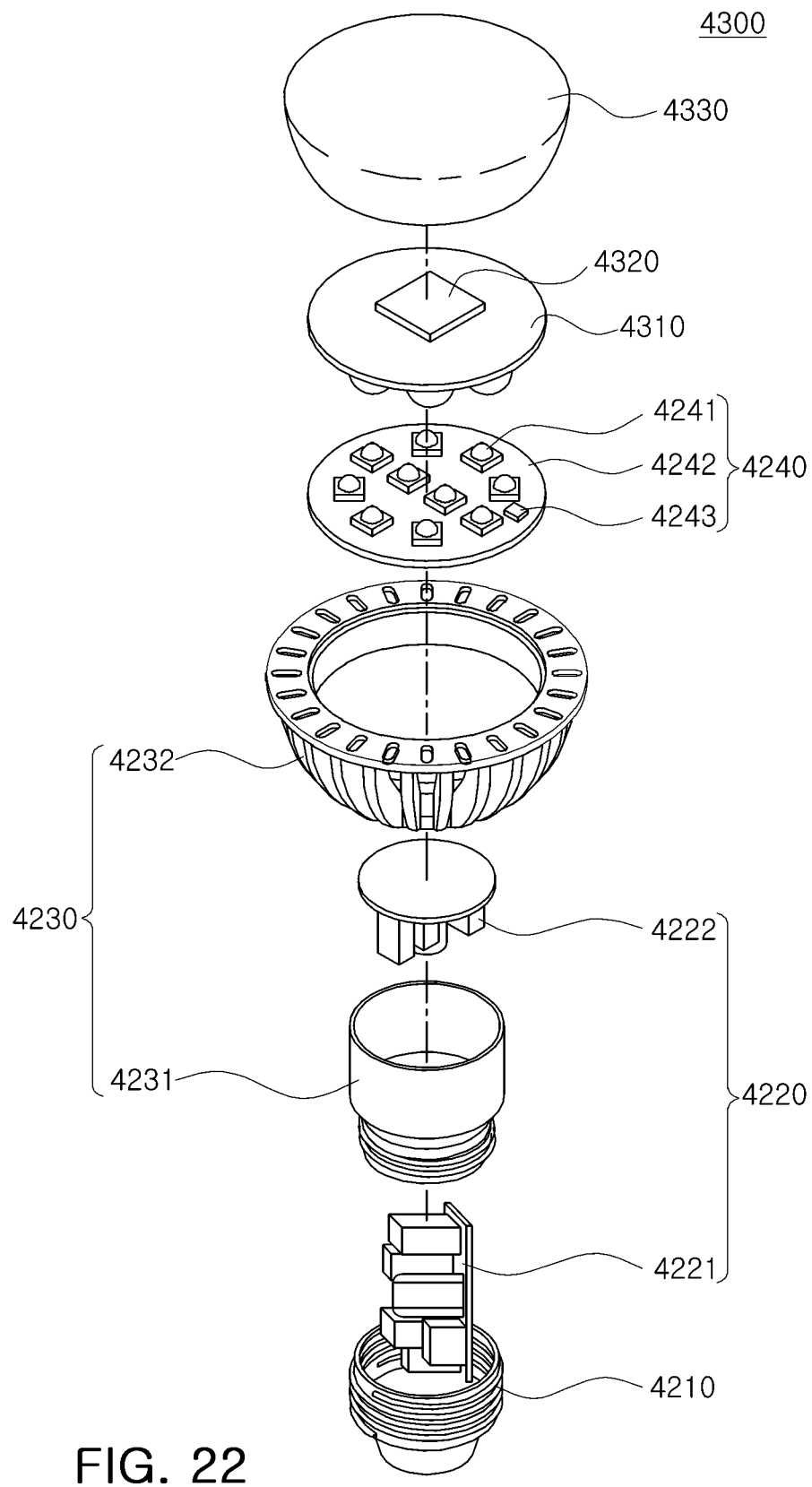
FIG. 22 is an exploded perspective view of a lamp including a semiconductor light-emitting device package according to an example embodiment and a communications module.
Figure 23:
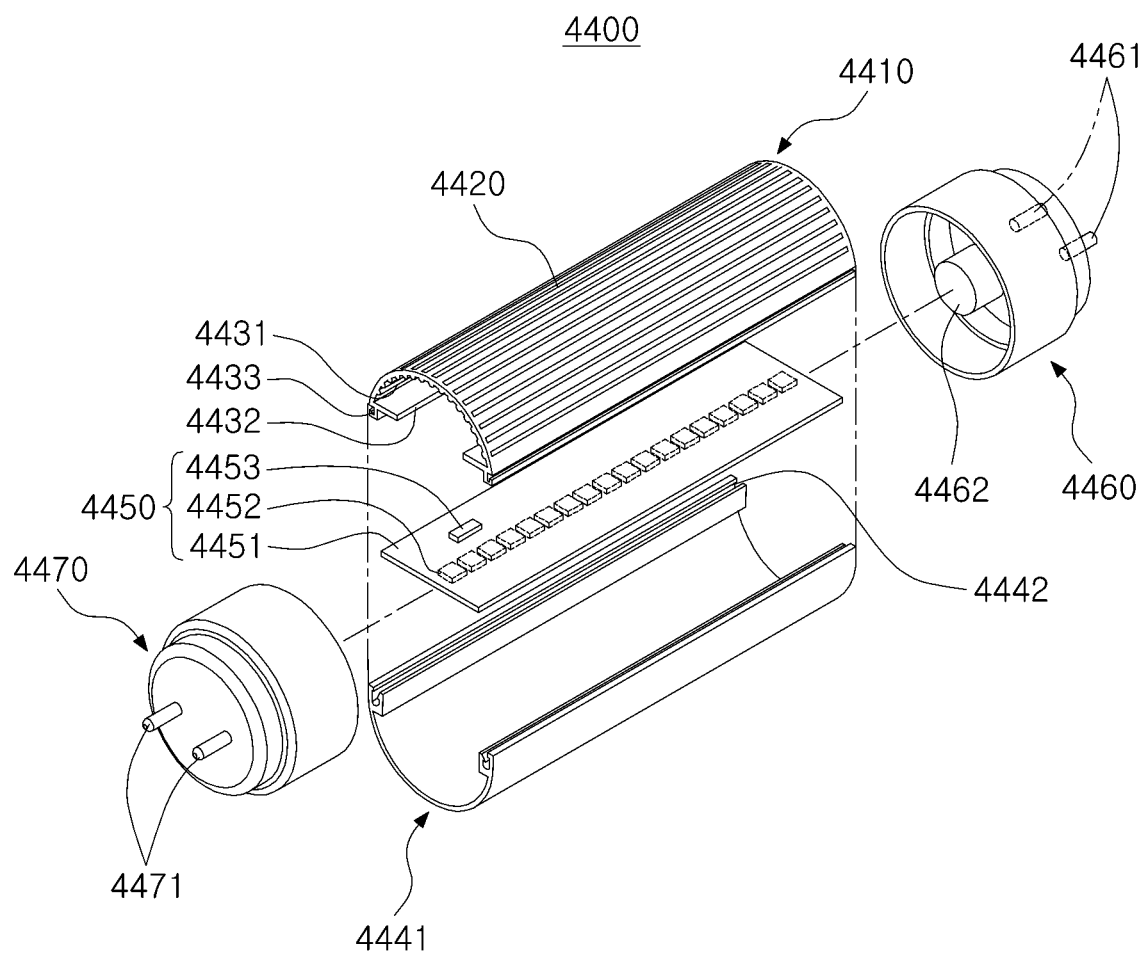
FIG. 23 is an exploded perspective view of a bar-type lamp employing a semiconductor light-emitting device package according to an example embodiment.

The above-described white light source module may be used as a light source module 4240 of a bulb-type lighting apparatus (refer to FIG. 22 or FIG. 23).

In a single light-emitting device package, light of a desirable color may be determined according to a wavelength of an LED chip, that is, the light-emitting device and a type and a mixing ratio of the phosphor. In addition, a color temperature and CRI of white light may be controlled.

For example, when an LED chip emits blue light, a light-emitting device package including at least one of yellow, green, and red phosphors may emit white light having a variety of color temperatures depending on a mixing ratio of the phosphor. Alternatively, a light-emitting device package including a blue LED chip and a green or red phosphor may emit green or red light. In this manner, a color temperature and CRI of white light may be controlled by combining a light-emitting device package emitting white light and a light-emitting device package emitting green or red light. In addition, the light-emitting device package may be configured to include at least one light-emitting device emitting violet, blue, green, red, or infrared light.

In this case, the lighting apparatus may be controlled to have CRI in the range from a level of a sodium (Na) lamp to a level of sunlight, and may generate white light having a variety level of color temperature in the range of 1500 K to 20,000 K. In addition, since the lighting apparatus may emit visible light having a violet, blue, green, red, or orange color, or infrared light, the color of the lighting apparatus may be controlled according to an environment or mood. In addition, the lighting apparatus may emit light having a specific wavelength to promote plant growth.

Figure 14:
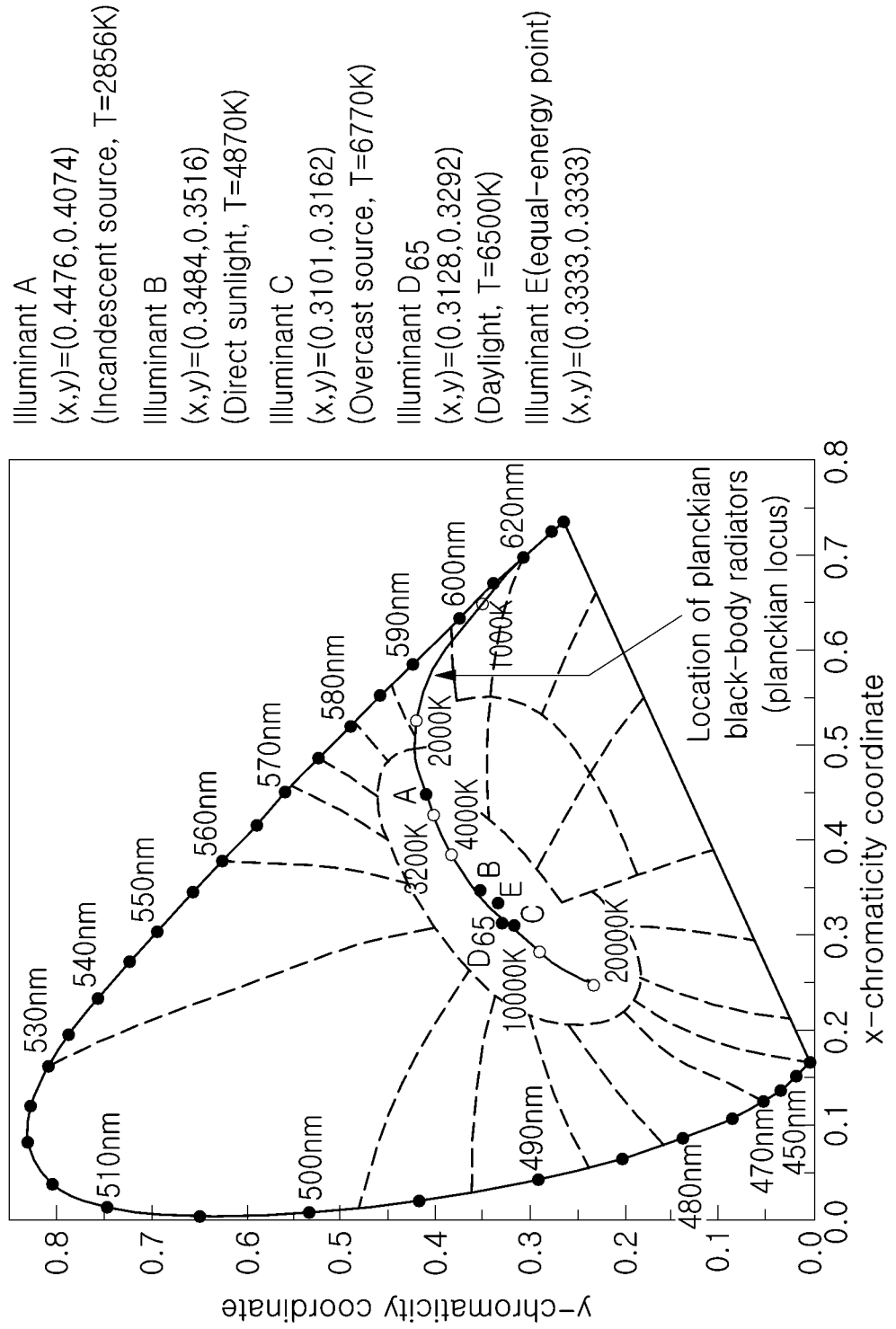
FIG. 14 is a CIE 1931 color space chromaticity diagram provided to illustrate a wavelength-converting material usable in a semiconductor light-emitting device package according to example embodiments.

FIG. 14 is a CIE 1931 color space chromaticity diagram provided to illustrate a wavelength-converting material usable in a semiconductor light-emitting device or a semiconductor light-emitting device package according to example embodiments.

Referring to the CIE 1931 color space chromaticity diagram illustrated in FIG. 14, white light formed by a combination of a UV or blue LED, and yellow, green, and red phosphors and/or green and red LEDs may have two or more peak wavelengths, and may be located on the line connecting (x, y) coordinates of (0.4476, 0.4074), (0.3484, 0.3516), (0.3101, 0.3162), (0.3128, 0.3292), (0.3333, 0.3333) in the CIE 1931 color space chromaticity diagram. In addition, the white light may be located in a zone surrounded by the line and a black body radiation spectrum. The color temperature of the white light may correspond to 2000 K to 20,000 K.

As a material converting a wavelength of light emitted from a semiconductor light-emitting device, various materials, such as a phosphor and/or a quantum dot may be used. In FIG. 12, white light around the coordinates E (0.3333, 0.3333) located below the black body radiation spectrum may be light in which light of a yellow-based component is relatively weak, and may be used as light sources of illuminations giving a more vivid or fresh feeling to the naked eye. Accordingly, illumination products using white light around the coordinates E (0.3333, 0.3333) located below the black body radiation spectrum may be usefully applied as lightings for shops that sell groceries, clothing, or the like.

As a material for converting a wavelength of light emitted from a semiconductor light-emitting device, various materials, such as phosphors and/or quantum dots, may be used.

The phosphors may have compositional formulas and colors as follows.

Oxide group: yellow and green $Y_3Al_5O_{12}$:Ce, $Tb_3Al_5O_{12}$:Ce, $Lu_3Al_5O_{12}$:Ce Silicate group: yellow and green $(Ba,Sr)_2SiO_4$:Eu, yellow and orange $(Ba,Sr)_3SiO_5$:Ce Nitride group: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, and 0<y≤4)— Formula (1)

(In Formula (1), Ln is at least one element selected from the group consisting of a Group Ma element and a rare earth element, and M is at least one element selected from the group consisting of Ca, Ba, Sr, and Mg)

Fluoride group: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ Basically, the composition of the phosphor may be consistent with stoichiometry, and each element may be substituted with another element within a corresponding group on the periodic table. For example, strontium (Sr) may be substituted with Ba, Ca, Mg, or the like in the alkaline earth (II) group, and Y may be substituted with Tb, Lu, Sc, Gd, or the like in the lanthanide group. In addition, Eu, an activator, may be substituted with Ce, Tb, Pr, Er, Yb, or the like according to a desired energy level. The activator may be used alone, or a coactivator may be further included to change characteristics of the phosphor.

In particular, a fluoride-based red phosphor may be coated with a fluoride without containing Mn, or a surface of the red phosphor or a surface of the fluoride without containing Mn may be further coated with an organic material, to improve reliability in high temperature/high humidity environments. Unlike other phosphors, a fluoride-based red phosphor may implement a narrow full width at half maximum (FWHM) of 40 nm or less, and therefore may be used in a high-definition TV such as a ultra-high definition (UHD) TV.

Table 1 below illustrates various types of phosphors of a white light-emitting device using a blue LED chip (having a wavelength of 440 nm to 460 nm) or a UV LED chip (having a wavelength 380 nm to 440 nm), listed by applications.

TABLE 1

| Purpose | Phosphor |
| --- | --- |
| LED TV Backlight Unit (BLU) | β-SiAlON:$Eu^{2+}$, (Ca, Sr)AlSiN$_3$:$Eu^{2+}$, La$_3$Si$_6$N$_{11}$:$Ce^{3+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, and 0 < y ≤ 4), $K_2TiF_6$:$Mn^{4+}$, NaYF$_4$:$Mn^{4+}$, NaGdF$_4$:$Mn^{4+}$, $K_3SiF_7$:$Mn^{4+}$ |
| Lighting Apparatuses | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, and 0 < y ≤ 4), $K_2TiF_6$:$Mn^{4+}$, NaYF$_4$:$Mn^{4+}$, NaGdF$_4$:$Mn^{4+}$, $K_3SiF_7$:$Mn^{4+}$ |
| Side Viewing (Mobile Devices, Laptop PCs) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, $K_2SiF_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, and 0 < y ≤ 4), $K_2TiF_6$:$Mn^{4+}$, NaYF$_4$:$Mn^{4+}$, NaGdF$_4$:$Mn^{4+}$, $K_3SiF_7$:$Mn^{4+}$ |
| Electronics (Vehicle | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, $K_2SiF_6$:$Mn^{4+}$, SrLiAl$_3$N$_4$:Eu, Ln$_{4-x}$ |

TABLE 1-continued

| Purpose | Phosphor |
| --- | --- |
| Headlamps, etc.) | $(Eu_zM_{1-z})_xSi_{12-y}Al_yO_{3+x+y}N_{18-x-y}$ ($0.5 \leq x \leq 3$, $0 < z < 0.3$, and $0 < y \leq 4$), $K_2TiF_6:Mn^{4+}$, $NaYF_4:Mn^{4+}$, $NaGdF_4:Mn^{4+}$, $K_3SiF_7:Mn^{4+}$ |

In addition, the wavelength conversion layer may include wavelength-converting materials, such as quantum dots (QDs), to replace the phosphor or to be mixed with the phosphor.

Figure 15:
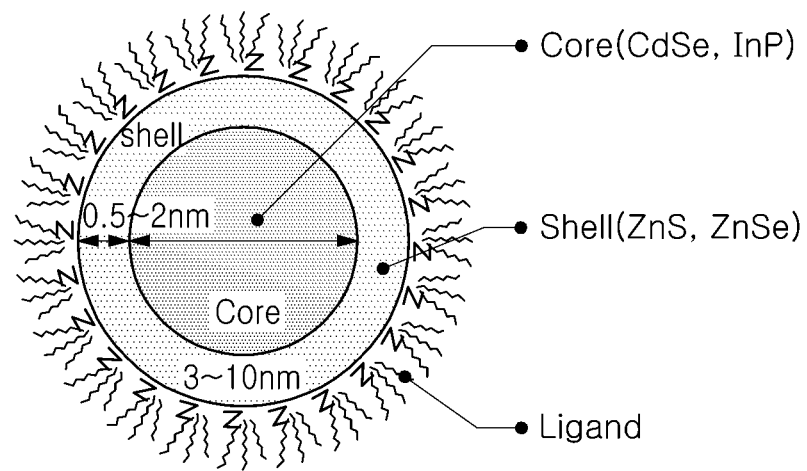
FIG. 15 is a cross-sectional view of a quantum dot employable in a semiconductor light-emitting device package according to example embodiments.

FIG. 15 is a cross-sectional view of a quantum dot employable in a semiconductor light-emitting device or a semiconductor light-emitting device package according to example embodiments.

Referring to FIG. 15, a quantum dot (QD) may have a core-shell structure formed of a II-VI group or III-V group compound semiconductor. For example, the quantum dot may include a core, such as CdSe or InP, and a shell, such as ZnS or ZnSe. In addition, the quantum dot may further include a ligand for stabilizing the core and the shell. For example, a diameter of the core may be in a range of 1 nm to 30 nm, and preferably but not necessarily 3 nm to 10 nm. A thickness of the shell may be in a range of 0.1 nm to 20 nm, and preferably but not necessarily 0.5 nm to 2 nm.

The quantum dot may implement a variety of colors according to a size thereof. In particular, when the quantum dot is used as a substitute material for the phosphor, the quantum dot may be used as a red or green phosphor. When the quantum dot is used, a FWHM (e.g. about 35 nm) may be implemented.

The wavelength-converting material may be provided as being included in an encapsulant. Alternatively, the wavelength-converting material may be prepared as a film in advance to be attached to a surface of an LED chip or an optical structure such as a light guide plate. In this case, the wavelength-converting material may have a uniform thickness to be easily applied to a target area.

Figure 16:
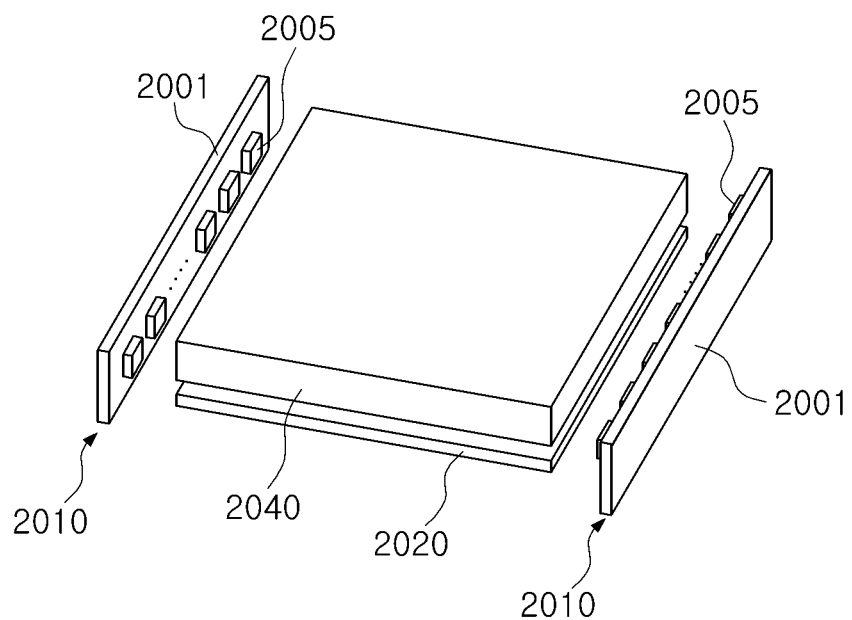
FIG. 16 is a perspective view of a backlight unit employing a semiconductor light-emitting device package according to an example embodiment.

FIG. 16 is a perspective view of a backlight unit employing a semiconductor light-emitting device package according to an example embodiment.

Referring to FIG. 16, a backlight unit 2000 may include a light guide plate 2040 and a light source module 2010 disposed at each side of the light guide plate 2040. In addition, the backlight unit 2000 may further include a reflector 2020 disposed below the light guide plate 2040. The backlight unit 2000 according to the example embodiment may be an edge-type backlight unit.

In some example embodiments, the light source module 2010 may be provided on only one side of the light guide plate 2040, or additionally provided to the other side of the light guide plate 2040. The light source module 2010 may include a printed circuit board (PCB) 2001 and a plurality of light sources 2005 mounted on the PCB 2001. Here, the plurality of light sources 2005 may include the semiconductor light-emitting devices according to the example embodiments.

Figure 17:
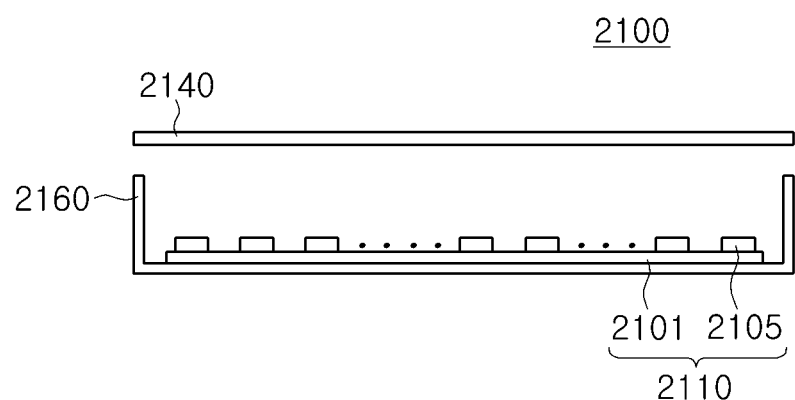
FIG. 17 is a cross-sectional view of a direct-type backlight unit employing a semiconductor light-emitting device package according to an example embodiment.

FIG. 17 is a cross-sectional view of a direct-type backlight unit employing a semiconductor light-emitting device package according to an example embodiment.

Referring to FIG. 17, a backlight unit 2100 may include a light diffusion plate 2140 and a light source module 2110 disposed below the light diffusion plate 2140. In addition, the backlight unit 2100 may further include a bottom case 2160 disposed below the light diffusion plate 2140 and accommodating the light source module 2110. The backlight unit 2100 according to the example embodiment may be a direct-type backlight unit.

The light source module 2110 may include a PCB 2101 and a plurality of light sources 2105 mounted on the PCB 2101. Here, the plurality of light sources 2105 may include the semiconductor light-emitting devices according to the example embodiments.

Figure 18:
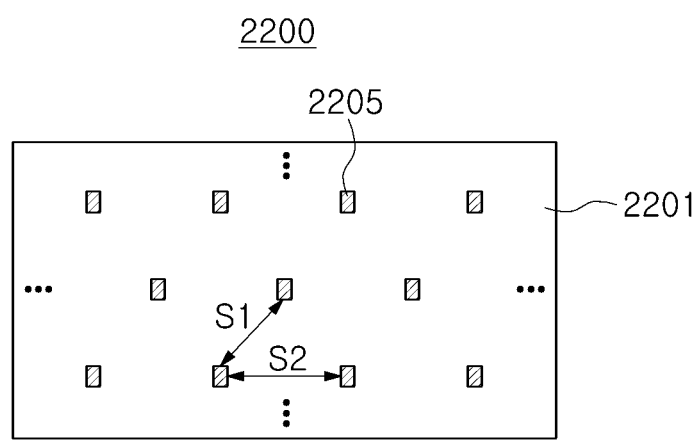
FIG. 18 is a cross-sectional view illustrating an arrangement of light sources of a direct-type backlight unit employing a semiconductor light-emitting device package according to an example embodiment.

FIG. 18 is a cross-sectional view illustrating an arrangement of light sources of a direct-type backlight unit employing a semiconductor light-emitting device package according to an example embodiment.

The direct-type backlight unit 2200 according to the example embodiment may include a plurality of light sources 2205 arranged on a substrate 2201. Here, the light sources 2205 may include the semiconductor light-emitting devices according to the example embodiments.

The light sources 2205 may have a matrix structure arranged in rows and columns, wherein each of the rows and columns has a zigzag pattern. That is, a second matrix may have the same structure as a first matrix and each of the plurality of light sources 2205 that are aligned in rows and columns in straight lines may be disposed between rows and columns of light sources of the first matrix. This may be understood that the light source 2205 belonging to the second matrix is disposed within an area defined by four adjacent light sources 2205 belonging to the first matrix.

However, the first matrix and the second matrix may be arranged in different structures and at different intervals, to improve brightness uniformity and light efficiency in the direct-type backlight unit. In addition to adjusting the arrangement structure of the plurality of light sources, distances Si and S2 between adjacent light sources may be determined to ensure brightness uniformity.

In this manner, the rows and columns of the light sources 2205 may be arranged in a zigzag manner, and thus the number of light sources 2205 may be reduced by about 15% to about 25% with respect to the same light-emitting area.

Figure 19:
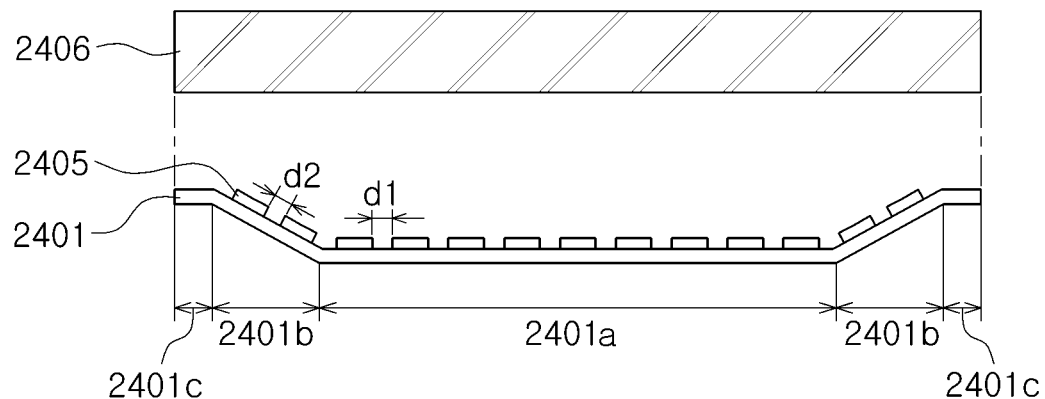
FIG. 19 is a cross-sectional view of a direct-type backlight unit employing a semiconductor light-emitting device package according to an example embodiment.

FIG. 19 is a cross-sectional view of a direct-type backlight unit employing a semiconductor light-emitting device package according to example embodiment.

Referring to FIG. 19, a backlight unit 2400 may include light sources 2405 mounted on a circuit board 2401, and one or more optical sheets 2406 disposed above the light sources 2405. The light sources 2405 may include the semiconductor light-emitting devices according to the example embodiments.

The circuit board 2401 employed in the example embodiment may include a first planar portion 2401a corresponding to a main portion of the circuit board 2401, an inclined portion 2401b, at least a part of which is angled, disposed around the first planar portion 2401a, and a second planar portion 2401c disposed in a corner of the circuit board 2401, that is, outside of the inclined portion 2401b. The light sources 2405 may be arranged at a first distance d1 on the first planar portion 2401a, and one or more light sources 2405 may also be arranged at a second distance d2 on the inclined portion 2401b. The first distance d1 may be the same as the second distance d2. A width of the inclined portion 2401*b* (or a length in a cross-sectional view) may be narrower than a width of the first planar portion 2401*a*, and greater than a width of the second planar portion 2401*c*. In addition, at least one light source 2405 may be arranged on the second planar portion 2401*c*, depending on an embodiment.

An inclination of the inclined portion 2401*b* with respect to the first planar portion 2401*a* may be greater than 0° and lower than 90°. By having this structure, the circuit board 2401 may maintain substantially uniform brightness even in the vicinity of an edge of the optical sheet 2406.

Figure 20:
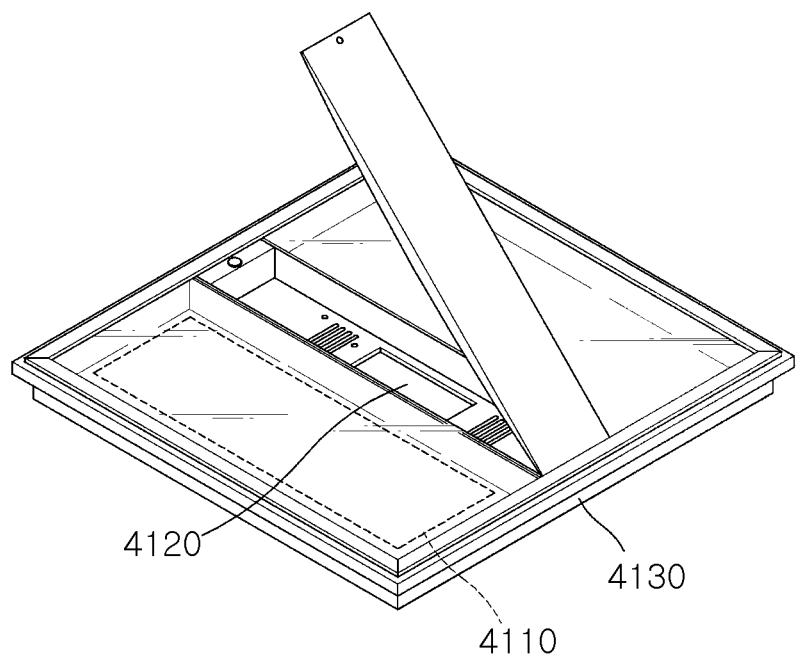
FIG. 20 is a perspective view of a flat panel lighting apparatus employing a semiconductor light-emitting device package according to an example embodiment.

FIG. 20 is a perspective view of a flat panel lighting apparatus employing a semiconductor light-emitting device package according to example embodiments.

Referring to FIG. 20, a flat panel lighting apparatus 4100 may include a light source module 4110, a power supply 4120, and a housing 4130. According to the example embodiment, the light source module 4110 may include a light-emitting device array as a light source, and the power supply 4120 may include a light-emitting device driver.

The light source module 4110 may include the light-emitting device array and have an overall planar shape. According to the example embodiment, the light-emitting device array may include a light-emitting device and a controller storing driving information of the light-emitting device. The light-emitting device may be a semiconductor light-emitting device according to the example embodiments.

The power supply 4120 may be configured to supply power to the light source module 4110. The housing 4130 may include an accommodating space to accommodate the light source module 4110 and the power supply 4120. In addition, the housing 4130 may be formed to have a hexahedral shape, one side of which is open, but is not limited thereto. The light source module 4110 may be disposed to emit light through the open side of the housing 4130.

Figure 21:
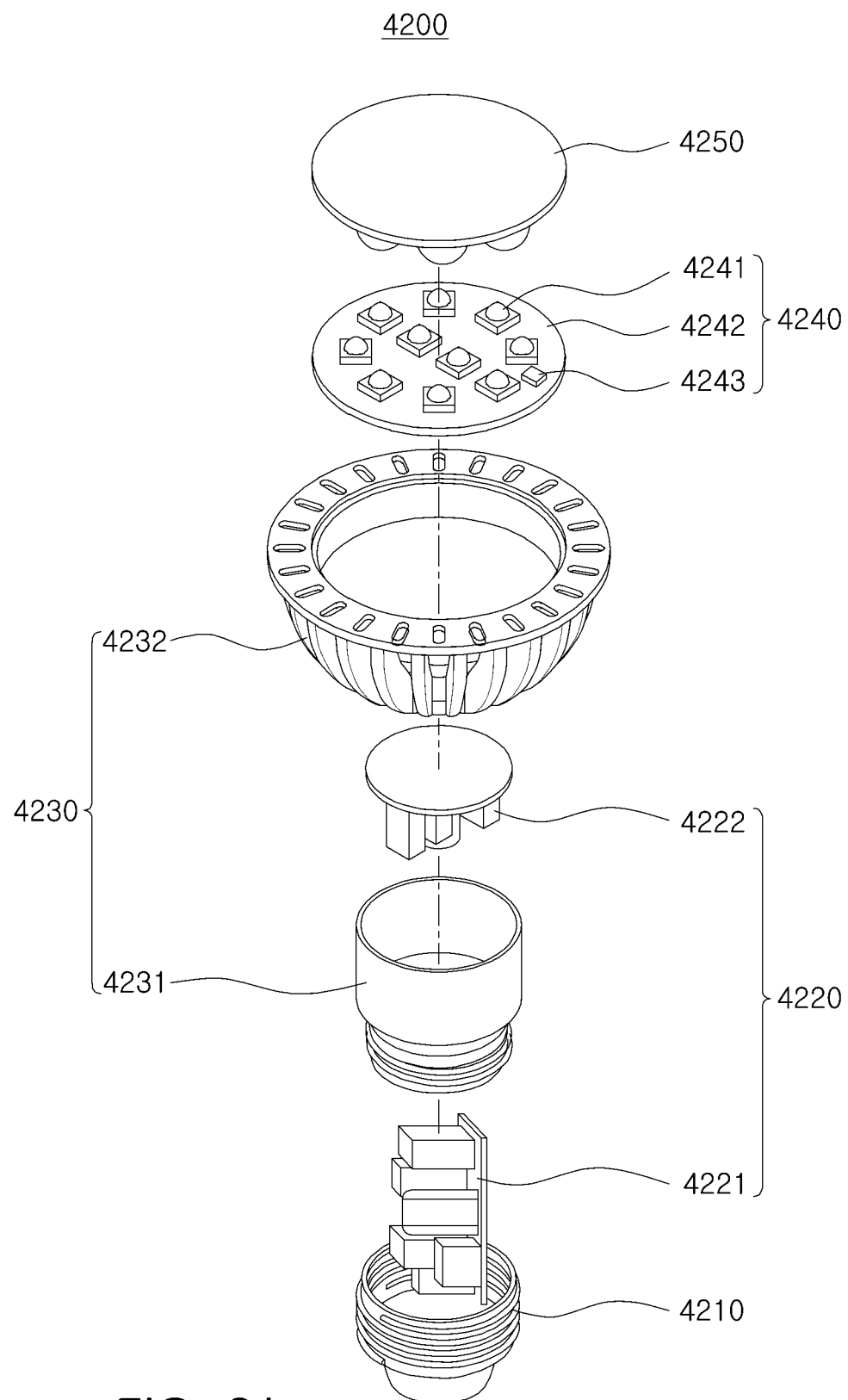
FIG. 21 is an exploded perspective view of a lamp including a semiconductor light-emitting device package according to an example embodiment and a communications module.

FIG. 21 is an exploded perspective view of a lamp including a semiconductor light-emitting device package according to an example embodiment and a communications module.

Referring to FIG. 21, a lighting apparatus 4200 may include a socket 4210, a power supply 4220, a heat sink 4230, the light source module 4240, and an optical unit 4250. According to the example embodiment, the light source module 4240 may include a light-emitting device array, and the power supply 4220 may include a light-emitting device driver.

The socket 4210 may be replaced by a normal lighting apparatus. The power supplied to the lighting apparatus 4200 may be applied through the socket 4210. As illustrated in FIG. 21, the power supply 4220 may be separated into a first power supply 4221 and a second power supply 4222. The heat sink 4230 may include an internal heat sink 4231 and an external heat sink 4232. The internal heat sink 4231 may be directly connected to the light source module 4240 and/or the power supply 4220, and may transmit heat to the external heat sink 4232. The optical unit 4250 may include an internal optical unit (not shown) and an external optical unit (not shown), and may be configured to uniformly spread light emitted from the light source module 4240.

The light source module 4240 may receive power from the power supply 4220 to emit light to the optical unit 4250. The light source module 4240 may include one or more light-emitting devices 4241, a circuit board 4242, and a controller 4243. The controller 4243 may store driving information of the light-emitting devices 4241. The light-emitting devices 4241 may be the semiconductor light-emitting devices according to the example embodiments.

FIG. 22 is an exploded perspective view of a lamp including a semiconductor light-emitting device package according to an example embodiment and a communications module.

Referring to FIG. 22, compared to the lighting apparatus 4200 illustrated in FIG. 21, a lighting apparatus 4300 according to the example embodiment may include a reflector 4310 on the light source module 4240. The reflector 4310 may function to uniformly spread light from light sources in a lateral and/or rearward direction to reduce glare.

A communications module 4320 may be mounted on the reflector 4310, and home-network communications may be implemented through the communications module 4320. For example, the communications module 4320 may be a wireless communications module using Zigbee®, wireless fidelity (Wi-Fi), or light fidelity (Li-Fi). The communications module 4320 may control functions such as power on/off or brightness adjustment of an interior and/or exterior light by using a smartphone or a wireless controller. In addition, the communications module 4320 may control electronics and car systems in and/or around the home, such as a television (TV), a refrigerator, an air conditioner, a door-lock, or an automobile, using a Li-Fi communications module using a visible light wavelength of the lighting apparatus installed in and/or around the home.

The reflector 4310 and the communications module 4320 may be covered by a cover 4330.

FIG. 23 is an exploded perspective view of a bar-type lamp employing a semiconductor light-emitting device package according to an example embodiment.

Referring to FIG. 23, a lighting apparatus 4400 may include a heat-dissipating member 4410, a cover 4441, a light source module 4450, a first socket 4460, and a second socket 4470. A plurality of heat-dissipating fins 4420 and 4431 may be disposed on an inner surface and/or an outer surface of the heat-dissipating member 4410 in the form of ridges, and the heat-dissipating fins 4420 and 4431 may be designed to have a variety of shapes and distances therebetween. An overhang-type support 4432 may be formed at an inner side of the heat-dissipating member 4410. The light source module 4450 may be fastened on the support 4432. A fastening protrusion 4433 may be formed at each end portion of the heat-dissipating member 4410.

A fastening groove 4442 may be formed on the cover 4441, and the fastening protrusion 4433 of the heat-dissipating member 4410 may be coupled with the fastening groove 4442 in a hook-coupling manner. Positions of the fastening groove 4442 and the fastening protrusion 4433 may be interchangeable.

The light source module 4450 may include a light-emitting device array. The light source module 4450 may include a PCB 4451, a light source 4452, and a controller 4453. As described above, the controller 4453 may store driving information of the light source 4452. Circuit interconnections for operating the light source 4452 may be formed on the PCB 4451. In addition, the PCB 4451 may further include other components to operate the light source 4452. The light source 4452 may include the semiconductor light-emitting device according to the example embodiments.

The first and second sockets 4460 and 4470 may be a pair of sockets, and may have a structure combined with both end portions of a cylindrical cover including the heat-dissipating member 4410 and the cover 4441. For example, the first socket 4460 may include an electrode terminal 4461 and a power device 4462, and the second socket 4470 may include a dummy terminal 4471. In addition, an optical sensor and/or a communications module may be embedded in one of the first socket 4460 and the second socket 4470. For example, the optical sensor and/or the communications module may be embedded in the second socket 4470 including the dummy terminal 4471. As another example, the optical sensor and/or the communications module may be embedded in the first socket 4460 including the electrode terminal 4461.

Figure 24:
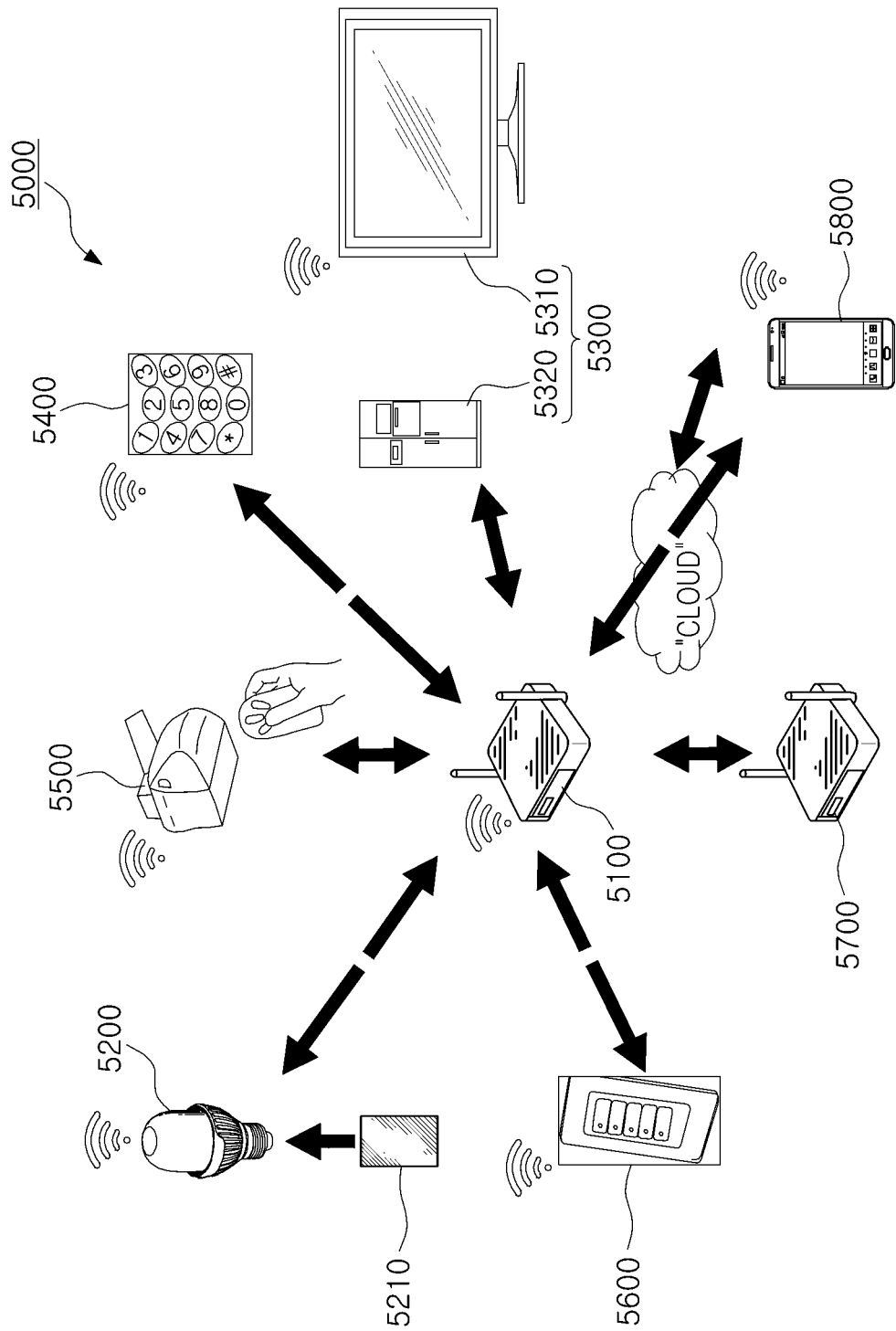
FIG. 24 is a schematic diagram illustrating an indoor lighting control network system employing a semiconductor light-emitting device package according to example embodiments.

FIG. 24 is a schematic diagram illustrating an indoor lighting control network system employing a semiconductor light-emitting device package according to example embodiments.

A network system 5000 according to the example embodiment may be a complex smart light-network system in which lighting technology using a light-emitting device such as an LED is combined with Internet of things (IoT) technology, wireless communications technology, or the like. The network system 5000 may be implemented using a variety of lighting apparatuses and wired/wireless communications apparatuses. The network system 5000 may be implemented by a sensor, a controller, a communications device, software for network control and maintenance, or the like.

The network system 5000 may be utilized in an open area, such as a park or a street, as well as in a closed space, such as a home or office defined within a building. The network system 5000 may be implemented based on an IoT environment so as to collect and/or process a variety of information and provide the information to a user. Here, an LED lamp 5200 included in the network system 5000 may control not only the illumination function by receiving information about a surrounding environment from a gateway 5100 but also operations of other apparatuses 5300 to 5800 belonging to the IoT environment based on, for example, a visible light communication function of the LED lamp 5200.

Referring to FIG. 24, the network system 5000 may include the gateway 5100 that processes data transmitted and received according to different communication protocols, the LED lamp 5200 connected to the gate way 5100 to enable communication and including a light-emitting device, and a plurality of apparatuses 5300 to 5800 connected to the gateway 5100 to enable communication according to a variety of wireless communication systems. To implement the network system 5000 based on the IoT environment, the LED lamp 5200 and each of the apparatuses 5300 to 5800 may include at least one communications module. In some example embodiments, the LED lamp 5200 may be connected to the gateway 5100 by a wireless communication protocol, such as Wi-Fi, Zigbee®, or Li-Fi, to enable communications. In this regard, the LED lamp 5200 may include at least one lamp communications module 5210. The LED lamp 5200 may include the semiconductor light-emitting device according to the example embodiments.

As described above, the network system 5000 may be utilized in an open area, such as a park or a street, as well as in a closed space, such as a home or office defined within a building. When the network system 5000 is utilized at home, the plurality of apparatuses 5300 to 5800 including a household appliance 5300, including a television 5310 or a refrigerator 5320, a digital door lock 5400, a garage door lock 5500, a wall-mounted lighting switch 5600, a router 5700 for wireless network relay, or a mobile apparatus 5800, such as a smartphone, a tablet, or a laptop computer may be connected to the gateway 5100 to perform communication based on the IoT technology.

In the network system 5000, the LED lamp 5200 may check an operating state of the plurality of apparatuses 5300 to 5800 by using a wireless communications network (e.g. Wi-Fi, Zigbee®, or Li-Fi), or may automatically control the intensity of the LED lamp 5200 according to surrounding environment and/or conditions. In addition, the LED lamp 5200 may control the apparatuses 5300 to 5800 belonging to the network system 5000 by using Li-Fi communications using visible light emitted from the LED lamp 5200.

For example, the LED lamp 5200 may automatically control the intensity thereof based on information about the surrounding environment transferred from the gateway 5100 through the lamp communications module 5210 or collected from the sensor installed in the LED lamp 5200. For example, the intensity of the LED lamp 5200 may be automatically controlled according to the type of a program being broadcast on the television 5310 or a brightness of a screen. To this end, the LED lamp 5200 may receive operating information of the television 5310 from the lamp communications module 5210 connected to the gateway 5100. The lamp communications module 5210 may be integrated and modularized with the sensor and/or controller included in the LED lamp 5200.

For example, when a program being broadcast on the television 5310 is a drama, a color temperature of the LED lamp 5200 may be lowered to 12,000 K or less (e.g. 6,000 K) according to a preset value, and color tones of the LED lamp 5200 may be adjusted to produce a cozy atmosphere. On the other hand, when the broadcast program is a comedy, the network system 5000 may be configured to increase the color temperature of the LED lamp 5200 to 6,000 K or more according to a preset value, and adjust the LED lamp 5200 to emit blue-based white light.

In addition, when a period of time elapses after the digital door lock 5400 is locked in the absence of people at home, all of the lighted LED lamps 5200 may be turned off to prevent power wastage. In addition, when the digital door lock 5400 is locked in the absence of people at home and a security mode is set through the mobile apparatus 5800, the LED lamp 5200 may be maintained in a turned-on state.

The operation of the LED lamp 5200 may be controlled according to the surrounding environment collected through various sensors connected to the network system 5000. For example, when the network system 5000 is implemented in a building, a light, a location sensor, and a communications module may be combined in the building, the light may be turned on or turned off by collecting information about locations of people in the building, or the collected information may be provided in real time to enable facility management or efficient use of idle spaces. Normally, lighting apparatuses such as the LED lamp 5200 may be placed in every space at each floor in a building, a variety of information may be collected through the sensor provided integrally with the LED lamp 5200, and the collected information may be utilized in the facility management or the use of idle spaces.

The LED lamp 5200 may be combined with an image sensor, a storage apparatus, the lamp communications module 5210, or the like to be utilized as an apparatus to maintain building security or detect and respond to an emergency. For example, when a smoke or temperature sensor is attached to the LED lamp 5200, an outbreak of fire may be quickly detected to minimize damages. Further, the brightness of the lightings may be controlled in consideration of external weather or sunlight to save energy and provide a comfortable lighting environment.

As set forth above, the semiconductor light-emitting device according to the example embodiments may increase transmittance of light emitted from the semiconductor light-emitting device, and increase reflectance of light re-incident to the semiconductor light-emitting device from the wavelength conversion layer, by introducing a light control layer on a main light-emitting surface thereof. Accordingly, light extraction efficiency of the semiconductor light-emitting device may be improved.

Although a few embodiments have been shown and described, it would be appreciated by those skilled in the art that changes may be made in the example embodiments without departing from the principles and spirit of the disclosure, the scope of which is defined in the claims and their equivalents.

What is claimed is:

1. A semiconductor light-emitting device, comprising:
   a light-emitting stack comprising a first conductivity-type semiconductor layer, a second conductivity-type semiconductor layer, and an active layer disposed between the first conductivity-type semiconductor layer and the second conductivity-type semiconductor layer;
   a wavelength conversion layer disposed on the light-emitting stack and configured to convert at least some of light having a first wavelength, emitted from the active layer, into light having a second wavelength; and
   a light control layer disposed between the light-emitting stack and the wavelength conversion layer, and comprising a first insulating layer and a second insulating layer,
   wherein the first insulating layer having a refractive index lower than a refractive index of the light-emitting stack, the second insulating layer having a refractive index higher than a refractive index of the first insulating layer by 0.5 or more, the first insulating layer including SiO2 and having a thickness in a range of 2 nm to 70 nm, and the second insulating layer including TiO2 and having a thickness in a range of 105 nm to 135 nm, to increase transmittance of light emitted from the light-emitting stack and incident to the wavelength conversion layer and increase reflectance of light emitted from the wavelength conversion layer and incident to the light-emitting stack.

2. The semiconductor light-emitting device of claim 1, wherein the refractive index of the first insulating layer is in a range of 1.4 to 1.8, and the refractive index of the second insulating layer is in a range of 2.2 to 2.5.

3. The semiconductor light-emitting device of claim 1, wherein the first insulating layer is disposed on the light-emitting stack, and the second insulating layer is disposed on the first insulating layer.

4. The semiconductor light-emitting device of claim 1, wherein the light control layer has a multilayer structure in which a plurality of first insulating layers and a plurality of second insulating layers are alternately and repeatedly stacked.

5. The semiconductor light-emitting device of claim 1, wherein a light-emitting surface of the light-emitting stack comprises an uneven structure, and the light control layer is disposed on the uneven structure.

6. The semiconductor light-emitting device of claim 1, further comprising a micro lens portion disposed between the light control layer and the wavelength conversion layer, the micro lens portion comprising protrusion portions that are convex toward the wavelength conversion layer.

7. The semiconductor light-emitting device of claim 6, wherein a refractive index of the micro lens portion is higher than a refractive index of the wavelength conversion layer.

8. The semiconductor light-emitting device of claim 1, further comprising a transparent electrode layer disposed on the first conductivity-type semiconductor layer,
   wherein the light control layer is disposed on the transparent electrode layer.

9. A semiconductor light-emitting device, comprising:
   a substrate comprising a first surface and a second surface facing opposite to the first surface;
   a light-emitting stack disposed on the first surface of the substrate;
   a wavelength conversion layer disposed on the second surface of the substrate and configured to convert at least some of light having a first wavelength, emitted from the light-emitting stack, into light having a second wavelength; and
   a light control layer disposed between the substrate and the wavelength conversion layer, and comprising a first insulating layer and a second insulating layer,
   wherein the first insulating layer having a refractive index lower than a refractive index of the light-emitting stack, the second insulating layer having a refractive index higher than a refractive index of the first insulating layer by 0.5 or more, the first insulating layer including $SiO_2$ and having a thickness in a range of 2 nm to 70 nm, and the second insulating layer including $TiO_2$ and having a thickness in a range of 105 nm to 135 nm, to increase transmittance of light emitted from the light-emitting stack and incident to the wavelength conversion layer and increase reflectance of light emitted from the wavelength conversion layer and incident to the light-emitting stack.

10. The semiconductor light-emitting device of claim 9, wherein the first insulating layer is in contact with the substrate.

11. The semiconductor light-emitting device of claim 9, further comprising a micro lens portion disposed between the light control layer and the wavelength conversion layer, the micro lens comprising protrusion portions that are convex toward the wavelength conversion layer.

12. The semiconductor light-emitting device of claim 11, wherein a refractive index of the micro lens portion is higher than a refractive index of the wavelength conversion layer.

13. The semiconductor light-emitting device of claim 9, wherein the light-emitting stack comprises a light-emitting nanostructure in which a first conductivity-type semiconductor nanocore, an active layer and a second conductivity-type semiconductor layer are sequentially stacked.

* * * * *